(12) United States Patent
Nishi

(10) Patent No.: US 6,836,093 B1
(45) Date of Patent: Dec. 28, 2004

(54) EXPOSURE METHOD AND APPARATUS

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 156 days.

(21) Appl. No.: 09/721,733

(22) Filed: Nov. 27, 2000

(30) Foreign Application Priority Data

Dec. 21, 1999 (JP) ............................................ 11-362591

(51) Int. Cl.[7] .............................................. B64C 17/06
(52) U.S. Cl. ............. 318/649; 318/568.16; 74/471 XY; 74/479.01; 248/638
(58) Field of Search ............................ 318/568.16, 625; 318/649; 74/471 XY, 479.01; 248/638; 269/71

(56) References Cited

U.S. PATENT DOCUMENTS

| | | | |
|---|---|---|---|
| 5,528,118 A | | 6/1996 | Lee |
| 5,780,943 A | | 7/1998 | Ono |
| 5,815,246 A | | 9/1998 | Sperling et al. |
| 5,982,128 A | * | 11/1999 | Lee ............................ 248/638 |
| 6,020,710 A | | 2/2000 | Lee |
| 6,049,186 A | * | 4/2000 | Lee ............................ 318/611 |
| 6,087,797 A | * | 7/2000 | Lee ............................ 248/638 |
| 6,150,787 A | * | 11/2000 | Lee ............................ 248/638 |
| 6,188,195 B1 | * | 2/2001 | Lee ............................ 248/638 |
| 6,246,202 B1 | * | 6/2001 | Lee ............................ 248/638 |
| 6,271,640 B1 | * | 8/2001 | Lee ............................ 318/560 |
| 6,281,654 B1 | * | 8/2001 | Lee ............................ 318/649 |
| 6,316,901 B2 | * | 11/2001 | Lee ............................ 248/638 |

FOREIGN PATENT DOCUMENTS

| | | |
|---|---|---|
| EP | 1 052 551 A2 | 11/2000 |
| GB | 2 290 658 A | 1/1996 |
| JP | A 10-163098 | 6/1998 |
| JP | A 11-214302 | 8/1999 |
| JP | A-11-243132 | 9/1999 |
| WO | WO 98/40791 | 9/1998 |
| WO | WO 00/39623 | 7/2000 |

OTHER PUBLICATIONS

U.S. patent application Ser. No. 09/721,733, Nishi, filed Nov. 27, 2000.

* cited by examiner

*Primary Examiner*—Marlon Fletcher

(57) ABSTRACT

There are provided an exposure method and an exposure apparatus in which the influence of vibration is not mutually transmitted so much when two movable stages are used. X axis sliders (19A, 20A) are arranged movably in the X direction on both sides in the Y direction of a wafer base (13). A first Y axis slider (16A) is arranged movably in the Y direction for the X axis sliders (19A, 20A). A first wafer stage (WST1) is arranged movably in the Y direction (scanning direction) along the Y axis slider (16A). X axis sliders (19B, 20B) are arranged in parallel to the X axis sliders (19A, 20A). A second Y axis slider (16B) is arranged for the X axis sliders (19B, 20B). A second wafer stage (WST2) is arranged movably along the Y axis slider (16B). When exposure is performed on the side of the first wafer stage (WST1), wafer exchange or wafer alignment is performed on the side of the second wafer stage (WST2).

56 Claims, 7 Drawing Sheets

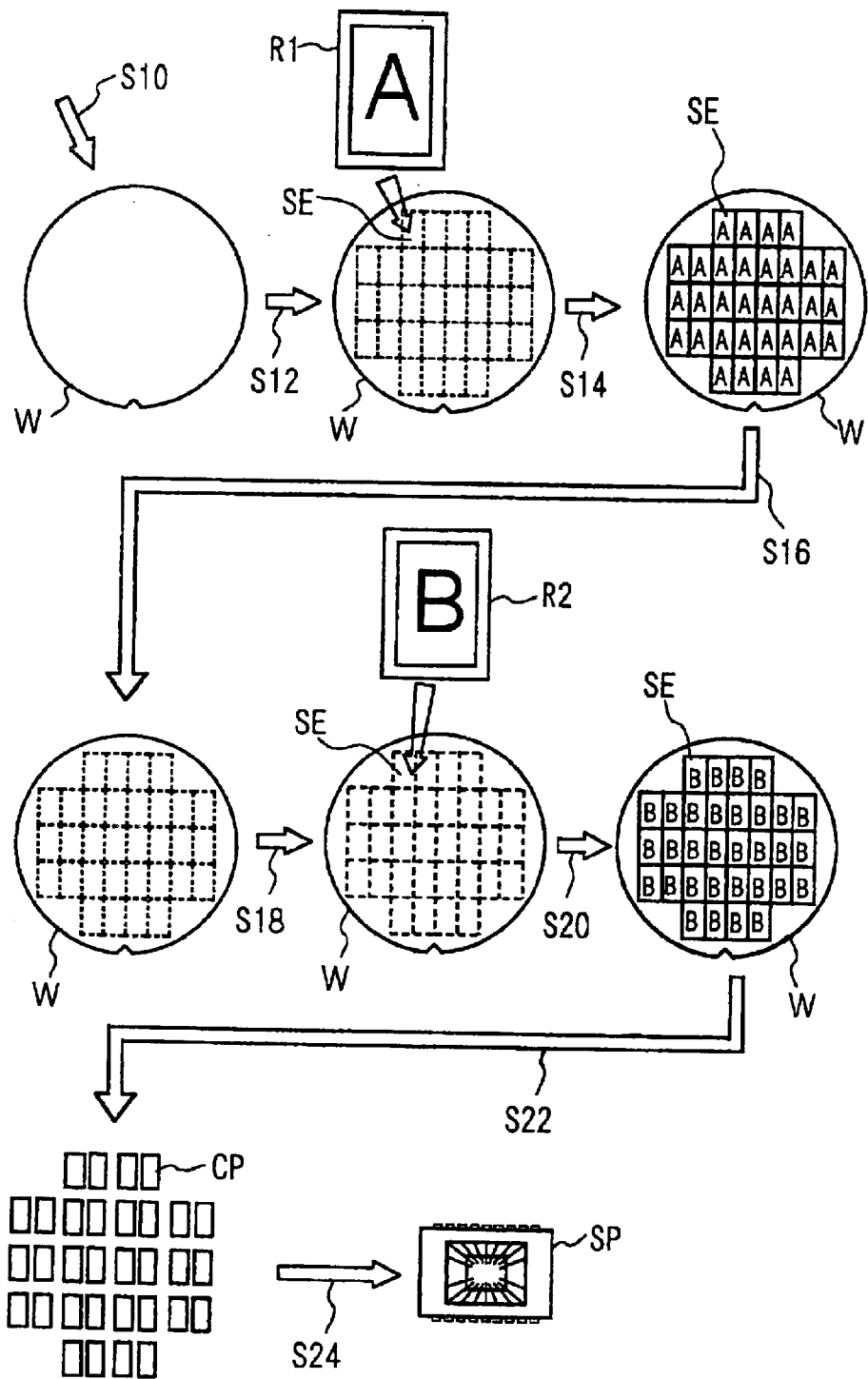

EXPOSURE METHOD AND APPARATUS

BACKGROUND OF THE INVENTION

1. Field of the Invention

The present invention relates to an exposure method and an exposure apparatus to be used, for example, when a mask pattern is transferred onto a substrate in the lithography step for producing, for example, semiconductor elements, liquid crystal display elements, plasma display elements, and thin film magnetic heads. In particular, the present invention relates to an exposure apparatus in which a vibration-preventive control is adopted.

2. Description of the Related Art

A high exposure accuracy is required for the exposure apparatus of the full field exposure type (stepper type) or the scanning exposure type (for example, those based on the step-and-scan system) to be used when the semiconductor element or the like is produced. Therefore, in the exposure apparatus, an arrangement, which makes it possible to perform highly accurate positioning or highly accurate scanning, is adopted for a reticle stage on which a reticle as a mask is placed and positioned and for a wafer stage on which a wafer as a substrate is placed and two-dimensionally moved respectively.

That is, the reticle stage for the conventional exposure apparatus of the scanning exposure type is arranged, for example, such that a frame-shaped coarsely movable stage, which is movable at an approximately constant velocity in the scanning direction, is placed on a reticle base, and a finely movable stage, on which the reticle is placed, is connected into the coarsely movable stage by the aid of an actuator which is used to performing positioning in a minute amount two-dimensionally. In this arrangement, the coarsely movable stage and the finely movable stage are slidably placed on the common reticle base by the aid of air bearings respectively.

Also in the case of the reticle stage for the conventional exposure apparatus of the full field exposure type, a driving unit such as a linear motor, which is used to drive a movable stage on which the reticle is placed, is installed on the reticle stage.

On the other hand, in recent years, in order to enhance the throughput, a so-called double-wafer stage, which is provided with two movable stages, has been suggested as a wafer stage for the exposure apparatus. When the double-wafer stage is used, the throughput can be improved by performing exchange and alignment for a wafer on the second movable stage during a period in which exposure is performed for a wafer on the first movable stage. The conventional double-wafer stage has been constructed as follows in order to simplify the arrangement. That is, a guide for one axis of two orthogonal driving axes is commonly used by the two movable stages, or the two movable stages are independently driven by using plane motors.

Further, a system, which is based on the mechanical contact such that upward and downward movement is performed, for example, with a cam mechanism, is adopted for the driving system for a sample base (Z leveling stage) for performing leveling and focusing in the conventional wafer stage.

The conventional exposure apparatus has been assembled on a base plate which is installed by the aid of a plurality of (for example, four) vibration-preventive pedestals including air dampers in order to mitigate the influence of vibration from the floor. However, when an excimer laser light source is used as an exposure light source, some of members of the exposure light source and the illumination optical system are supported by support members different from the base plate. Recently, in order to allow other stage sections and other components to be not affected by the vibration generated in respective stage sections of the exposure apparatus, a system has been also suggested, in which a wafer base for supporting a wafer stage and a reticle base for supporting a reticle stage are supported mutually independently by a plurality of active type vibration-preventive units including air dampers and electromagnetic control units respectively.

Among the double-wafer stages of the conventional exposure apparatuses as described above, as for the arrangement in which the guide for one axis of the orthogonal axes is used for both of the two movable stages, an inconvenience arises such that the influence of vibration of the second movable stage tends to be transmitted to the first movable stage. For this reason, for example, it is necessary to provide certain restriction for the control sequence, for example, such that the high speed movement operation of the second movable stage is avoided during the transfer operation of the first movable stage. It has been impossible to increase the throughput so much.

Further, the conventional sample base (Z leveling stage) has been driven in accordance with the system based on the mechanical contact. Therefore, the following inconvenience arises. That is, it is impossible to increase the response speed so much, and the vibration from the bottom surface side of the movable stage tends to be transmitted to the wafer.

Taking the foregoing viewpoints into consideration, a first object of the present invention is to provide an exposure method and an exposure apparatus in which the influence of vibration is hardly transmitted among a plurality of movable stages to one another, and the exposure accuracy can be maintained to be high, when the plurality of movable stages for substrates (for example, wafers) as exposure objectives are provided.

A second object of the present invention is to provide an exposure method and an exposure apparatus in which the external vibration is hardly transmitted to a movable stage for a substrate as an exposure objective, and a high exposure accuracy can be obtained.

A third object of the present invention is to provide an exposure method and an exposure apparatus which make it possible to perform the leveling or the focusing for a substrate as an exposure objective at a high speed, in which the influence of vibration is scarcely exerted on the substrate.

Another object of the present invention is to provide a production method which makes it possible to efficiently produce the exposure apparatus as mentioned above, and a method for producing highly accurate devices, based on the use of the exposure method as mentioned above.

SUMMARY OF THE INVENTION

A first exposure method according to the present invention lies in an exposure method for exposing a second object with an exposure light beam via a first object (R1); the exposure method comprising preparing a first movable stage (14A) on which a first substrate (W1) as the second object is placed, and a second movable stage (14B) on which a second substrate (W2) as the second object is placed; two-dimensionally driving the first and second movable stages on a predetermined guide surface respectively; and dealing with reaction forces, which are generated when the first and second movable stages are driven, independently from each other.

According to the present invention as described above, the influence of vibration is scarcely transmitted mutually between the two movable stages. Therefore, the exposure accuracy is maintained to be high.

When this invention is applied to a scanning exposure type exposure method, the first object and the second object are relatively moved in a predetermined direction during the process in which a pattern on the first object is transferred to the second object. For this purpose, it is desirable that the first and second movable stages are driven while substantially satisfying law of conservation of momentum respectively when the first and second movable stages are driven in the predetermined direction. Accordingly, it is possible to perform the scanning exposure more stably.

A first exposure apparatus according to the present invention lies in an exposure apparatus for exposing a second object with an exposure light beam via a first object (R1); the exposure apparatus comprising a first movable stage (14A) on which a first substrate (W1) as the second object is placed; a second movable stage (14B) on which a second substrate (W2) as the second object is placed; and a stage-driving system (16A to 22A, 23YA, 28XA, 29XA, 16B to 22B) which drives the first movable stage and the second movable stage two-dimensionally respectively and which deals with reaction forces generated when the first and second movable stages are driven, independently from each other.

According to the present invention as described above, the two movable stages are movably placed on predetermined base members (12, 13), for example, in accordance with an air bearing system. The reaction forces, which are generated when the two movable stages are driven, are dealt with independently from each other, for example, in accordance with a system in which the law of conservation of momentum is satisfied mutually independently, or a system in which the reaction forces are released to the floor surface mutually independently. Therefore, the influence of vibration is scarcely transmitted mutually between the two movable stages. Accordingly, the exposure accuracy is maintained to be high.

The stage-driving system includes, for example, a first driving system (16A to 22A, 23YA, 28XA, 29XA) which drives the first movable stage in a first direction and a second direction which are intersected with each other respectively while substantially satisfying law of conservation of momentum; and a second driving system (16B to 22B) which drives the second movable stage in the first direction and the second direction respectively while substantially satisfying the law of conservation of momentum, independently from the first driving system. When the first and second movable stages are driven independently from each other while substantially satisfying the law of conservation of momentum as described above, the vibration of the whole of the first and second movable stages is scarcely transmitted to other stage systems and other components. Therefore, it is possible to obtain a more satisfactory exposure accuracy.

For example, the first driving system includes a pair of first slide members (19A, 20A) which are disposed in parallel to one another in the first direction (X direction) with a movement area of the first movable stage interposed therebetween and which are arranged movably in the first direction; a second slide member (16A) which is arranged movably in the second direction (Y direction) with respect to the first slide members; a first driving unit (28XA, 29XA) which relatively drives the second slide member in the first direction with respect to the first slide members; and a second driving unit (23YA) which relatively drives the first movable stage in the second direction with respect to the second slide member; and the second driving system includes a pair of third slide members (19B, 20B) which are disposed in parallel to the first slide members with a movement area of the second movable stage interposed therebetween and which are arranged movably in the first direction; a fourth slide member (16B) which is arranged movably in the second direction with respect to the third slide members; a third driving unit (28XB, 29XB) which relatively drives the fourth slide member in the first direction with respect to the third slide members; and a fourth driving unit (23YB) which relatively drives the second movable stage in the second direction with respect to the fourth slide member.

When the first slide members and the third slide members are arranged in parallel as described above, the first driving system and the second driving system can be arranged in a compact form without causing any mechanical interference.

It is desirable that the first object and the second object are relatively moved in the second direction (Y direction) when the second object is exposed with the exposure light beam; and the exposure apparatus further comprises a position-correcting driving unit which is provided to correct positions of the second slide member and the fourth slide member in the second direction respectively. This means that the present invention is applied to an exposure apparatus based on the scanning exposure system. In this case, when the scanning exposure is successively performed for respective shot areas on the first substrate or the second substrate, the position of the second slide member or the fourth slide member is corrected to be, for example, in the vicinity of the neutral position (center of the movable range) between the shots. Accordingly, the scanning exposure can be always performed while substantially satisfying the law of conservation of momentum. Thus, the exposure accuracy is improved.

In this case, when the scanning exposure is performed by successively inverting the scanning direction for a plurality of comparted areas (shot areas) arranged in one array along the first direction (non-scanning direction) on the second object, the second slide member (or the fourth slide member) performs only the reciprocating motion in accordance with the law of conservation of momentum. Therefore, the average position is scarcely changed, and it is almost unnecessary to correct the position in the second direction. On the other hand, when the exposure objective is migrated from a certain array to the next array on the second object, the second slide member remains as it is after being moved in the first direction. Therefore, it is desirable to correct the position by using the position-correcting driving unit. Accordingly, it is possible to shorten the second slide member, and it is possible to miniaturize the exposure apparatus.

It is desirable for the first exposure apparatus that the first and second movable stages are driven in first and second directions which are intersected with each other; the first object and the second object are relatively moved in the second direction when the second object is exposed with the exposure light beam; and the exposure apparatus further comprises a first position-measuring unit (35AX, 35BX) which is arranged to measure positions of the first and second movable stages in the first direction independently from each other; a plurality of second position-measuring units (36YA to 36YE) which are arranged at predetermined intervals in the first direction to measure positions of the first and second movable stages in the second direction; and a measuring unit-switching system (97) which delivers a measured value between the plurality of second position-measuring units when the first and second movable stages are moved in the first direction.

According to this arrangement, when the two movable stages are moved in the first direction in order to alternately move the two movable stages to the exposure position for the second object, the measured value of the position in the second direction is not interrupted by successively delivering the measured values obtained by the plurality of second position-measuring units. Therefore, the two movable stages can be driven highly accurately and independently from each other. Further, during the scanning exposure, the position in the second direction as the scanning direction can be continuously measured by using one second position-measuring unit (any one of 36YA to 36YE). Therefore, a high exposure accuracy is obtained.

A method for producing the first exposure apparatus according to the present invention lies in a method for producing an exposure apparatus for exposing a second object with an exposure light beam via a first object; the method comprising placing, on a predetermined base member, a first movable stage on which a first substrate as the second object is placed and a second movable stage on which a second substrate as the second object is placed; and installing a stage-driving system which drives the first and second movable stages two-dimensionally respectively and which deals with reaction forces generated when the first and second movable stages are driven, independently from each other. The first exposure apparatus of the present invention can be efficiently produced by means of the production method as described above.

In still another aspect, a second exposure method according to the present invention lies in an exposure method for exposing a second object (W1) with an exposure light beam via a first object (R1); the exposure method comprising preparing a movable stage (14A) which is arranged movably at least in a one-dimensional direction and a sample base (15A) which is arranged movably two-dimensionally with respect to the movable stage and on which the second object is placed; and two-dimensionally driving the sample base with respect to the movable stage in a plane parallel to a guide surface on which the movable stage is placed so that law of conservation of momentum is substantially satisfied.

According to the present invention, for example, the external vibration is attenuated between the movable stage and the sample base. Therefore, a high exposure accuracy is obtained.

In this arrangement, it is desirable that the sample base is supported in a state in which the sample base is tiltable and movable in a direction perpendicular to the guide surface with respect to the movable stage; and an attitude of the sample base with respect to the movable stage is controlled so that an exposure plane of the second object on the sample base is conformed to an image plane of the first object. Accordingly, it is possible to perform the leveling or the focusing for the second object at a high speed.

In still another aspect, a second exposure apparatus according to the present invention lies in an exposure apparatus for exposing a second object (W1) with an exposure light beam via a first object (R1); the exposure apparatus comprising a movable stage (14A) which is arranged movably at least in a one-dimensional direction; a sample base (15A) which is arranged movably two-dimensionally with respect to the movable stage and on which the second object is placed; and a first driving unit (42XA, 42XB, 42Y) which drives the sample base two-dimensionally with respect to the movable stage in a plane substantially parallel to a surface on which the movable stage is placed so that law of conservation of momentum is substantially satisfied.

According to the exposure apparatus as described above, the external vibration is attenuated between the movable stage and the sample base. Therefore, the vibration is hardly transmitted to the second object. Accordingly, for example, the overlay accuracy is improved, and a high exposure accuracy is obtained.

In this arrangement, it is desirable that the sample base is placed on the movable stage with a gas-based or liquid-based vibration-preventive member (40A to 40C) intervening therebetween; and the exposure apparatus further comprises a second driving unit (41ZA to 41ZC) which drives the sample base with respect to the movable stage in a non-contact state in a direction substantially perpendicular to the surface on which the movable stage is placed. The law of conservation of momentum can be satisfied with the simple arrangement owing to the vibration-preventive member, and the influence of vibration from the outside is further decreased. Further, the second driving unit makes it possible to perform the leveling or the focusing for the second object at a high speed.

In still another aspect, a third exposure apparatus according to the present invention lies in an exposure apparatus for exposing a second object (W1) with an exposure light beam via a first object (R1); the exposure apparatus comprising a movable stage (14A) which is arranged movably at least in a one-dimensional direction; a buffer member (39) which is arranged movably two-dimensionally with respect to the movable stage; a sample base (15A) which is arranged movably two-dimensionally with respect to the buffer member and on which the second object is placed; and a first driving unit (42XA, 42XB, 42Y) which drives the buffer member two-dimensionally with respect to the movable stage.

According to the exposure apparatus as described above, the external vibration is attenuated by the buffer member (39) disposed between the movable stage and the sample base. Therefore, the vibration is hardly transmitted to the second object. Accordingly, for example, the overlay accuracy is improved, and a high exposure accuracy is obtained.

In this arrangement, it is desirable that the buffer member is placed on the movable stage with a gas-based or liquid-based vibration-preventive member (40A to 40C) intervening therebetween; and the first driving unit drives the buffer member with respect to the movable stage in a plane substantially parallel to a surface on which the movable stage is placed. Accordingly, the buffer member can be driven with the simple arrangement in a state in which the law of conservation of momentum is substantially satisfied.

It is desirable that the vibration-preventive member is, for example, an electromagnetic damper having a position-measuring function.

It is desirable that the exposure apparatus further comprises a second driving unit (43XA, 43XB, 43Y) which drives the sample base two-dimensionally with respect to the buffer member in a non-contact state in the plane substantially parallel to the surface on which the movable stage is placed.

It is desirable that the exposure apparatus further comprises a third driving unit (41ZA, 41ZB, 41ZC) which drives the sample base with respect to the buffer member in a non-contact state in a direction substantially perpendicular to the surface on which the movable stage is placed at a plurality of positions. Owing to the use of the third driving unit, it is possible to perform the leveling or the focusing for the second object at a high speed.

It is desirable that the exposure apparatus further comprises a slide member (16A) which is driven in a first direction and which is arranged movably in a second direction intersecting the first direction; a fourth driving unit (23YA) which drives the movable stage relatively with respect to the slide member in the second direction; and a position-correcting driving unit (24A) which is provided to correct a position of the slide member in the second direction.

In still another aspect, a method for producing the second exposure apparatus according to the present invention lies in a method for producing an exposure apparatus for exposing a second object with an exposure light beam via a first object; the method comprising arranging a movable stage (14A) movably at least in a one-dimensional direction on a predetermined base member (12, 13); arranging, movably two-dimensionally with respect to the movable stage, a sample base (15A) on which the second object is placed; and installing a first driving unit (42XA, 42XB, 42Y) which drives the sample base two-dimensionally with respect to the movable stage in a plane substantially parallel to a surface on which the movable stage is placed so that law of conservation of momentum is substantially satisfied.

In still another aspect, a method for producing the third exposure apparatus according to the present invention lies in a method for producing an exposure apparatus for exposing a second object with an exposure light beam via a first object; the method comprising arranging a movable stage (14A) movably at least in a one-dimensional direction on a predetermined base member (12, 13); arranging a buffer member (39) movably two-dimensionally with respect to the movable stage; arranging, movably two-dimensionally with respect to the buffer member, a sample base (15A) on which the second object is placed; and installing a first driving unit (42XA, 42XB, 42Y) which drives the buffer member two-dimensionally with respect to the movable stage. According to the production methods as described above, the second and third exposure apparatuses of the present invention can be efficiently produced.

In still another aspect, a fourth exposure apparatus according to the present invention lies in an exposure apparatus for exposing a second object (W1) with an exposure light beam via a first object (R1); the exposure apparatus comprising a movable member (14A) which holds one of the first and second objects; a first guide member (16A) which defines movement of the movable member in a first direction; and a support mechanism (17A, 17B) which supports the first guide member so that the first guide member is moved while substantially satisfying-law of conservation of momentum during the movement of the movable member.

According to the exposure apparatus described above, when the movable member (for example, movable stage) is driven in the first direction, the first guide member is moved so that the law of conservation of momentum is satisfied. Therefore, the influence of vibration is mitigated.

In this arrangement, it is desirable that the movable member is coupled to the first guide member substantially in a non-contact manner, and the support mechanism supports the first guide member substantially in a non-contact manner. Accordingly, the influence of external vibration is further reduced.

It is desirable that the exposure apparatus further comprises a driving unit (28XA, 29XA) which drives the first guide member so that the movable member is moved in a second direction perpendicular to the first direction, and a second guide member (19A, 20A) which defines movement of the first guide member in the second direction, wherein the second guide member is moved while satisfying the law of conservation of momentum during the movement of the movable member.

Accordingly, the movable member (movable stage) is driven so that the law of conservation of momentum is satisfied in the two directions perpendicular to one another. Therefore, the influence of vibration is reduced even when the movable member is driven in any direction.

In still another aspect, a fifth exposure apparatus according to the present invention lies in an exposure apparatus for exposing a second object (W1) with an exposure light beam via a first object (R1); the exposure apparatus comprising a movable member (W1) which holds one of the first and second objects; a first guide member (16A) which defines movement of the movable member in a first direction and which is movable in a second direction perpendicular to the first direction; a second guide member (19A, 20A) which defines movement of the first guide member in the second direction; and a support mechanism (21A, 22A) which supports the second guide member so that the second guide member is moved while substantially satisfying law of conservation of momentum during the movement of the movable member.

According to the exposure apparatus as described above, when the movable member (movable stage) is driven in the second direction by the aid of the second guide member, the second guide member is moved so that the law of conservation of momentum is satisfied. Therefore, the influence of vibration is reduced.

In the arrangements described above, for example, the first and second objects are relatively moved with respect to the exposure light beam respectively to perform scanning exposure for the second object with the exposure light beam; and the movable member holds the second object, and the movable member is moved in the first direction during the scanning exposure.

In still another aspect, a method for producing a device according to the present invention comprises the step of performing exposure by using any one of the exposure methods and the exposure apparatuses of the present invention. The influence of vibration is mitigated, and a high exposure accuracy is obtained according to the present invention. Therefore, it is possible to produce the device having the high function which is excellent, for example, in pattern faithfulness (for example, line width resolution).

BRIEF EXPLANATION OF THE DRAWINGS

FIG. 9 shows exemplary steps of producing a semiconductor device according to the embodiment.

DESCRIPTION OF THE PREFERRED EMBODIMENTS OF THE INVENTION

An exemplary preferred embodiment of the present invention will be explained below with reference to the drawings. In this embodiment, the present invention is applied to a projection exposure apparatus based on the scanning exposure system of the step-and-scan system.

Figure 1:
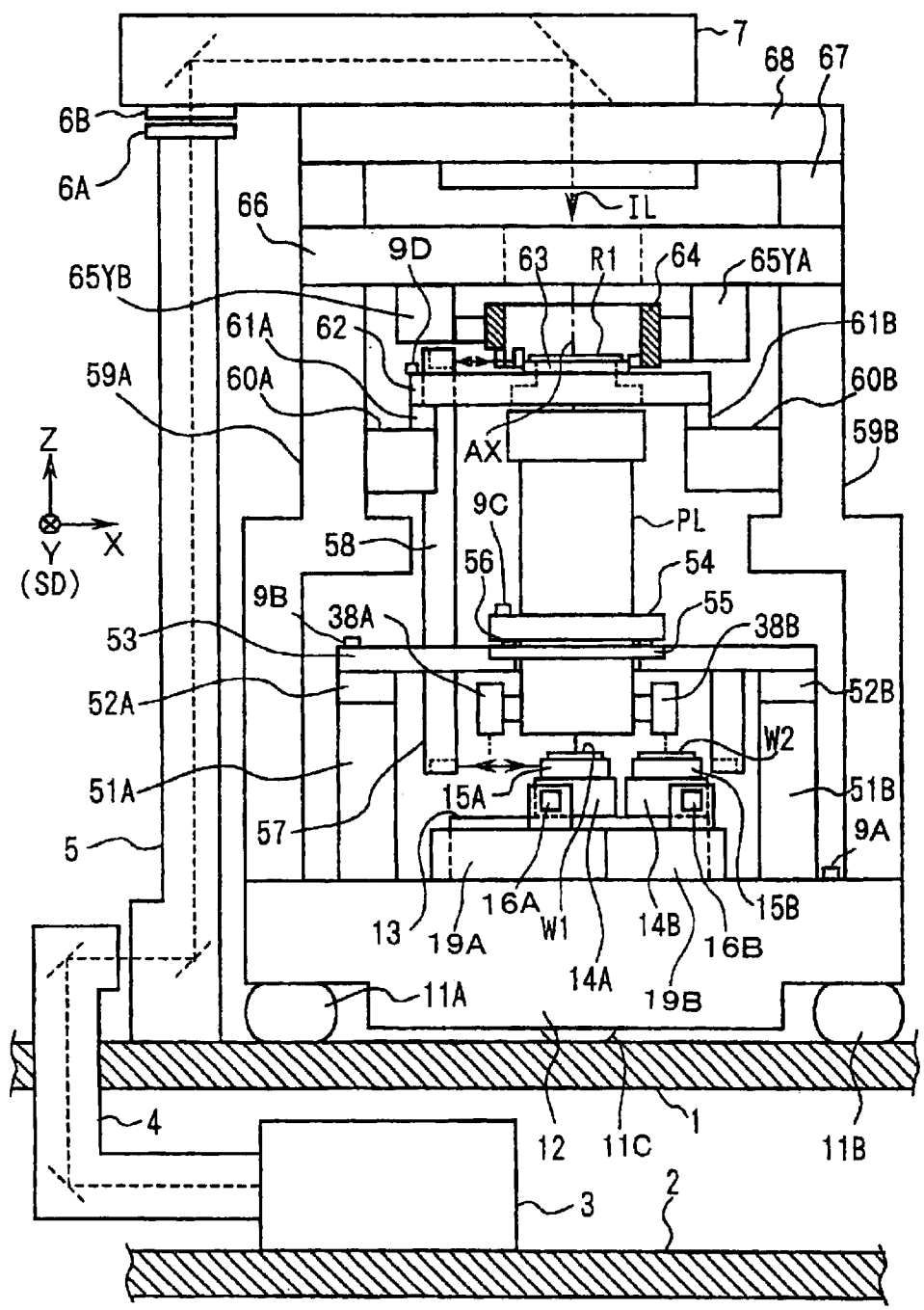
FIG. 1 shows, with partial cutaway, a schematic arrangement illustrating a projection exposure apparatus of an exemplary embodiment according to the present invention.

FIG. 1 shows the projection exposure apparatus according to this embodiment. With reference to FIG. 1, for example, most parts of the projection exposure apparatus of this embodiment are installed on a floor 1 in a clean room in a semiconductor-manufacturing factory. An exposure light source 3 of the projection exposure apparatus is installed on a floor 2 in a semi-clean room in a machine room disposed thereunder. Those usable as the exposure light source 3 include, for example, an excimer laser light source such as KrF (wavelength: 248 nm) and ArF (wavelength: 193 nm), an $F_2$ laser light source (wavelength: 157 nm), a $Kr_2$ laser light source (wavelength: 146 nm), a high harmonic wave generator of a YAG laser, a high harmonic wave generator of a semiconductor laser, and a mercury lamp.

An exposure light beam IL as an exposure beam, which is radiated from the exposure light source 3 during the exposure, passes along a beam matching unit (BMU) 4, and it is introduced beyond the floor 1. The exposure light beam IL, which outgoes from the BMU 4, comes into a first illumination system 5 which is installed on the floor 1 and which includes, for example, a beam-shaping optical system, an optical integrator (uniformizer or homogenizer) for uniformizing the illuminance distribution, a light amount monitor, a variable aperture diaphragm, and a relay lens system. The light-outgoing plane of the first illumination system 5 is substantially conjugate with a pattern plane of a reticle as an illumination object. A movable field diaphragm 6A is arranged on the light-outgoing plane. The movable field diaphragm 6A plays the following role. That is., upon the start and the end of the scanning exposure for respective shot areas on a wafer as a substrate to be exposed, the field is opened/closed so that any pattern other than the original circuit pattern is not subjected to exposure. The first illumination system 5, which is arranged with the movable field diaphragm 6A which involves such a fear that the vibration may be generated when the field is opened/closed, is supported separately from a main exposure apparatus body. Therefore, the exposure accuracy (for example, overlay accuracy and transfer faithfulness) is improved for the main exposure apparatus body.

The movable field diaphragm 6A is constructed as follows. That is, the movable field diaphragm 6A not only opens/closes the field, i.e., changes the width of the field concerning the scanning direction upon the start and the end of the scanning exposure, but also it can change the width of the field in the non-scanning direction depending on the size of a circuit pattern as the transfer objective concerning the non-scanning direction prior to the scanning exposure.

Alternatively, the following arrangement may be available. That is, the first illumination system 5 is supported on the floor 1 by the aid of a vibration-preventive mechanism of the active type or the passive type.

The exposure light beam IL, which has passed through the movable field diaphragm 6A, comes into a fixed field diaphragm 6B which is arranged at a light-incoming plane of a second illumination system 7 attached to a column section of the main exposure apparatus body, i.e., a plane defocused by a predetermined amount from the pattern plane of the reticle. The fixed field diaphragm 6B is formed with an aperture for defining the illumination area on the pattern plane of the reticle to be a slit-shaped area which is slender in the non-scanning direction perpendicular to the scanning direction. The exposure light beam IL, which has passed through the fixed field diaphragm 6B, passes along, for example, a relay lens system, an optical path-bending mirror, and a condenser lens system in the second illumination system 7, and it illuminates the illumination area of the pattern plane of the reticle R1 as a mask.

The position of the fixed field diaphragm 6B is not limited to the light-incoming plane of the second illumination system 7. The fixed field diaphragm 6B may be arranged, for example, at the light-outgoing plane of the second illumination system 7, i.e., the plane separated by a predetermined amount from the pattern plane of the reticle, or at a plane disposed between the reticle and the projection optical system PL and separated by a predetermined amount from the pattern plane.

Under the exposure light beam IL, the image of the pattern in the illumination area on the reticle R1 is projected onto a slit-shaped exposure area on the wafer W1 (or W2) applied with photoresist as a photosensitive substrate (substrate to be exposed) at a projection magnification β (β is, for example, ¼-fold or ⅕-fold) by the aid of the projection optical system PL. In this state, the reticle R1 and the wafer W1 are synchronously moved in the predetermined scanning direction by using the projection magnification β as a velocity ratio. Accordingly, the image of the pattern on the reticle R1 is transferred to one shot area on the wafer W1. The reticle R1 and the wafer W1, W2 correspond to the first object and the second object of the present invention respectively. The wafer W1, W2 is, for example, a disk-shaped substrate of semiconductor (for example, silicon) or SOI (silicon on insulator).

As disclosed, for example, in International Publication (WO) 00/39623, those usable as the projection optical system PL include, for example, a cata-dioptric system of the normal cylinder type constructed by arranging a plurality of dioptric lenses along one optical axis and two concave mirrors having openings in the vicinity of the optical axis respectively, and a dioptric system of the normal cylinder type constructed by arranging dioptric lenses along one optical axis. WO 00/39623 is incorporated herein by reference. A cata-dioptric system having a form in which an optical axis is bent in a V-shaped configuration, or a cata-dioptric system of the double-cylinder type may be used for the projection optical system PL. The following explanation will be made assuming that the Z axis extends in parallel to the optical axis AX of the projection optical system PL, the X axis extends in the non-scanning direction (i.e., the direction parallel to the plane of paper of FIG. 1) perpendicular to the scanning direction for the reticle R1 and the wafer W1 during the scanning exposure in the plane (substantially coincident with the horizontal plane in this embodiment) perpendicular to the Z axis, and the Y axis extends in the scanning direction (i.e., the direction perpendicular to the plane of paper of FIG. 1).

At first, explanation will be made for the overall arrangement of the main exposure apparatus body of this embodiment including a stage system for supporting the reticle R1, the projection optical system PL, and a stage system for supporting the wafers W1, W2. That is, a base plate 12 having high rigidity, which serves as a first base member, is installed by the aid of three vibration-preventive pedestals 11A, 11B, 11C approximately located at apexes of a regular triangle on the floor 1. An electric level 9A is installed on the base plate 12. Each of the vibration-preventive pedestals 11A to 11C is an active type vibration-preventive unit including a mechanical damper such as an air damper or a hydraulic pressure-based damper which is endurable to a heavy weight, and an electromagnetic damper which is composed of an electromagnetic actuator such as a voice coil motor. For example, the electromagnetic dampers in the three vibration-preventive pedestals 11A to 11C are driven, and the pneumatic pressure or the hydraulic pressure of each of the mechanical dampers is controlled, if necessary, so that the angles of inclination of the upper surface of the base plate 12 with respect to the horizontal plane detected by the level 9A (angles of inclination about the two axes, i.e., about the X axis and the Y axis) are included within allowable ranges. In this arrangement, the vibration having a high frequency from the floor is attenuated by the mechanical damper before being transmitted to the main exposure apparatus body. The remaining vibration having a low frequency is attenuated by the electromagnetic damper. In place of the level 9A (also the other levels), for example, a detector for optically detecting the inclination of the corresponding member may be used.

Three first columns 59A, 59B (third column is not shown) are fixed on the upper surface of the base plate 12 so that they are approximately located at apexes of a regular triangle. A support plate 66, which is provided at its central portion with an opening for allowing the exposure light beam IL to pass therethrough, is fixed on the upper surfaces of the first columns 59A to 59C. A support plate 68 is fixed on the support plate 66 with spacers 67 intervening therebetween. The second illumination system 7 is attached to the support plate 68. Variable mount sections 61A, 61B, each of which functions as an attitude control member, are fixed on three projections 60A, 60B (third projection is not shown) fixed to the inner surfaces of the three first columns 59A and so forth. Those usable as each of the variable mount sections 61A and so forth include a piezoelectric device such as a piezoelectric element, and a driving element such as a magnetostrictive element which has a large rigidity and which is expandable/contractible in the Z direction at a high response speed (for example, the amplitude is about several μm, and the frequency is about 10 Hz to 1 kHz). Besides, those also usable as each of the variable mount sections 61A and so forth include a driving mechanism which makes displacement in the Z direction by means of a small cam mechanism. In view of the fact that the rigidity is high, the variable mount section 61A and so forth can be also referred to as "hard mount".

A reticle base 62, which serves as a base member (second base member), is fixed the three variable mount sections 61A and so forth. An opening for allowing the exposure light beam IL to pass therethrough is formed at a central portion of the reticle base 62. The upper surface of the reticle base 62 is machined into a guide surface which has an extremely excellent flatness. A finely movable stage 63, which serves as a movable stage on the reticle side, is slidably placed on the guide surface smoothly and two-dimensionally by the aid of air bearings. The reticle R1 is held on the finely movable stage 63, for example, by means of vacuum attraction. Another reticle (not shown) is held in an area adjacent to the reticle R1 in the scanning direction on the finely movable stage 63. The exposure apparatus is constructed so that, for example, the double exposure can be efficiently executed.

An electric level 9D is installed at an end portion of the guide surface of the reticle base 62. For example, the expansion/contraction amounts (or displacement amounts) of the three variable mount sections 61A and so forth are controlled so that angles of inclination of the guide surface with respect to the horizontal plane detected by the level 9D (angles of inclination about the two axes, i.e., about the X axis and the Y axis) are included within allowable ranges. In this procedure, it is enough to control the angles of inclination about the two axes at the minimum. Therefore, for example, one of the three variable mount sections 61A and so forth may be a spacer with a fixed height.

A rectangular frame-shaped coarsely movable stage 64 is arranged so that the finely movable stage 63 of this embodiment is surrounded thereby. A pair of Y axis driving units 65YA, 65YB are attached to the bottom surface of the support plate 66 disposed thereover so that they extend in parallel in the Y direction. The coarsely movable stage 64 is connected to the Y axis driving units 65YA, 65YB. The coarsely movable stage 64 is out of contact with the reticle base 62. The coarsely movable stage 64 and the finely movable stage 63 are connected to one another by the aid of an actuator which drives the finely movable stage 63 with respect to the coarsely movable stage 64 in a minute amount in the X direction, the Y direction, and the direction of rotation within predetermined narrow ranges. The Y axis driving units 65YA, 65YB alternately drive the coarsely movable stage 64 in the +Y direction and the −Y direction at a constant velocity in accordance with the linear motor system. That is, the coarsely movable stage 64 drives the finely movable stage 63 in the Y direction at the constant velocity in a state of being held so that the coarsely movable stage 64 is hung from the support plate 66. Further, the finely movable stage 63 is relatively driven with respect to the coarsely movable stage 64 so that any remaining synchronization error is corrected. The two-dimensional position and the angle of rotation of the finely movable stage 63 and the position of the coarsely movable stage 64 in the Y direction are highly accurately measured by unillustrated laser interferometers respectively. The position and the velocity of the finely movable stage 63 are controlled on the basis of obtained results of the measurement.

In this embodiment, the reticle stage system is constructed, for example, by the reticle base 62, the finely movable stage 63, and the coarsely movable stage 64.

Further, three second columns 51A, 51B (third column is not shown) are fixed approximately at positions of apexes of a regular triangle at the inside of the first columns 59A, 59B and so forth on the upper surface of the base plate 12. Three variable mount sections 52A, 52B (third variable mount section is not shown), which serve as attitude control members respectively, are fixed on the upper surfaces of the second columns 51A and so forth. Those usable as each of the variable mount sections 52A and so forth include, for example, a driving element based on the use of a piezoelectric element or the like and a driving mechanism based on the cam system in the same manner as the variable mount section 61A described above. A support plate 53, which serves as a base member (third base member), is fixed on the variable mount sections 52A and so forth. The projection optical system PL is installed to a U-shaped cutout provided for the support plate 53 by the aid of a flange 54. An open end of the cutout is closed by a cover 55. An electric level 9B is installed at an end portion of the upper surface of the support plate 53. For example, the expansion/contraction amounts (or displacement amounts) of the three variable mount sections 52A and so forth are controlled so that angles of inclination of the upper surface with respect to the horizontal plane detected by the level 9B (angles of inclination about the two axes, i.e., about the X axis and the Y axis) are included within allowable ranges. Also in this procedure, it is enough to control the angles of inclination about the two axes at the minimum. Therefore, for example, one of the three variable mount sections 52A and so forth may be a spacer with a fixed height.

Driving elements 56, each of which is composed of, for example, a magnetostrictive element or a piezoelectric device such as a piezoelectric element to serve as an attitude control member, each of which has high rigidity, and each of which is expandable/contractible in the Z direction (direction of the optical axis AX), are installed at three places at intervals of approximately equal angles between the support plate 53 and the flange 54 for holding the projection optical system PL. An electric level 9C is installed to an end portion of the upper surface of the flange 54. For example, the expansion/contraction amounts of the three driving elements 56 are controlled so that angles of inclination of the upper surface with respect to the horizontal plane detected by the level 9C (angles of inclination about the two axes, i.e., about the X axis and the Y axis) are included within allowable ranges. Also in this procedure, it is enough to control the angles of inclination about the two axes at the minimum. Therefore, for example, one of the three driving elements 56 may be a spacer with a fixed height. As described above, the driving elements 56 for suppressing the vibration of the projection optical system PL itself are provided in addition to the variable mount sections 52A and so forth for suppressing the vibration of the support plate 53. Therefore, the vibration of the cylindrical projection optical system PL is intensely suppressed, and the image formation characteristic is maintained in a well-suited manner.

Alignment sensors 38A, 38B, which are based on the image formation system of the off-axis system and the FIA (Field Image Alignment) system, are fixed to the side surfaces in the −X direction and the +X direction at the lower end portion of the projection optical system PL in order to perform the alignment for the wafer. Although not shown, a reticle alignment microscope is arranged at the bottom surface portion of the support plate 66 disposed over the reticle R1 in order to perform the alignment for the reticle.

A wafer base 13 is fixed at a central portion in an area which is substantially surrounded by the three second columns 51A, 51B and so forth on the upper surface of the base plate 12. The upper surface of the wafer base 13 is machined into a guide surface which has an extremely excellent flatness. A first movable stage 14A on the side of the wafer is slidably placed on the guide surface smoothly by the aid of air bearings and two-dimensionally along sliders 16A, 19A. A first sample base 15A is placed on the movable stage 14A. The first wafer W1 is held on the sample base 15A by means of, for example, vacuum attraction. The movable stage 14A is continuously movable in the Y direction, for example, in accordance with the linear motor system, and it is movable in a stepping manner in the X direction and the Y direction. The sample base 15A is constructed such that it is finely movable in the X direction, the Y direction, and the direction of rotation with respect to the movable stage 14A, it is displaceable in the Z direction, and it is tiltable about the two axes (i.e., about the X axis and the Y axis) in order to perform the leveling and the focusing. That is, the sample base 15A is constructed so that it can be driven in six degrees of freedom. Alternatively, the sample base 15A may be constructed so that it can be driven in five degrees of freedom or less. In this embodiment, a second movable stage 14B is placed on the wafer base 13 by the aid of air bearings movably along sliders 16B, 19B together with the first movable stage 14A. The second wafer W2 is placed on the movable stage 14B by the aid of a second sample base 15B for the purpose of the leveling and the focusing. The second movable stage 14B is also driven two-dimensionally, for example, in accordance with the linear motor system so that the second movable stage 14B does not mechanically interfere with the movable stage 14A. The sample base 15B is constructed so that it can be driven in six degrees of freedom with respect to the second movable stage 14B.

The wafer stage system of this embodiment is constructed by the wafer base 13, the movable stages 14A, 14B, the sample bases 15A, 15B, and the driving mechanisms therefor. That is, the wafer stage system of this embodiment resides in the double-wafer stage system. For example, the wafer W2 can be subjected to the exchange and the alignment on the side of the movable stage 14B as the second wafer stage during the scanning exposure for the wafer W1 on the side of the movable stage 14A as the first wafer stage. Therefore, it is possible to obtain a high throughput.

The two-dimensional positions, the yawing amounts, the pitching amounts, and the rolling amounts of the movable stages 14A, 14B are measured highly accurately by unillustrated laser interferometers. The focus position of the wafer during the exposure (position of the projection optical system PL in the optical axis direction) is measured by an unillustrated autofocus sensor. For example, the positions of the movable stages 14A, 14B and the angles of inclination of the sample bases 15A, 15B are controlled on the basis of obtained measured values. Laser interferometers for measuring, for example, the positions and the angles of rotation of the movable stages 14A, 14B may be provided separately from the laser interferometers described above to be used for the sample bases 15A, 15B.

The main body section of the laser interferometer on the side of the wafer is fixed to an interferometer support member 57 which is fixed to the bottom surface of the support plate 53. The main body section of the laser interferometer on the side of the reticle is fixed to an interferometer support member 58 which is fixed to the upper surface of support plate 53. The support plate 53 of this embodiment is suppressed for the influence of the external vibration by the aid of the variable mount sections 52A and so forth. Therefore, the position can be measured highly accurately by using the laser interferometer.

Next, detailed explanation will be made below with reference to FIGS. 2 to 5 for the entire arrangement of the wafer stage system based on the double-wafer stage system of this embodiment.

Figure 2:
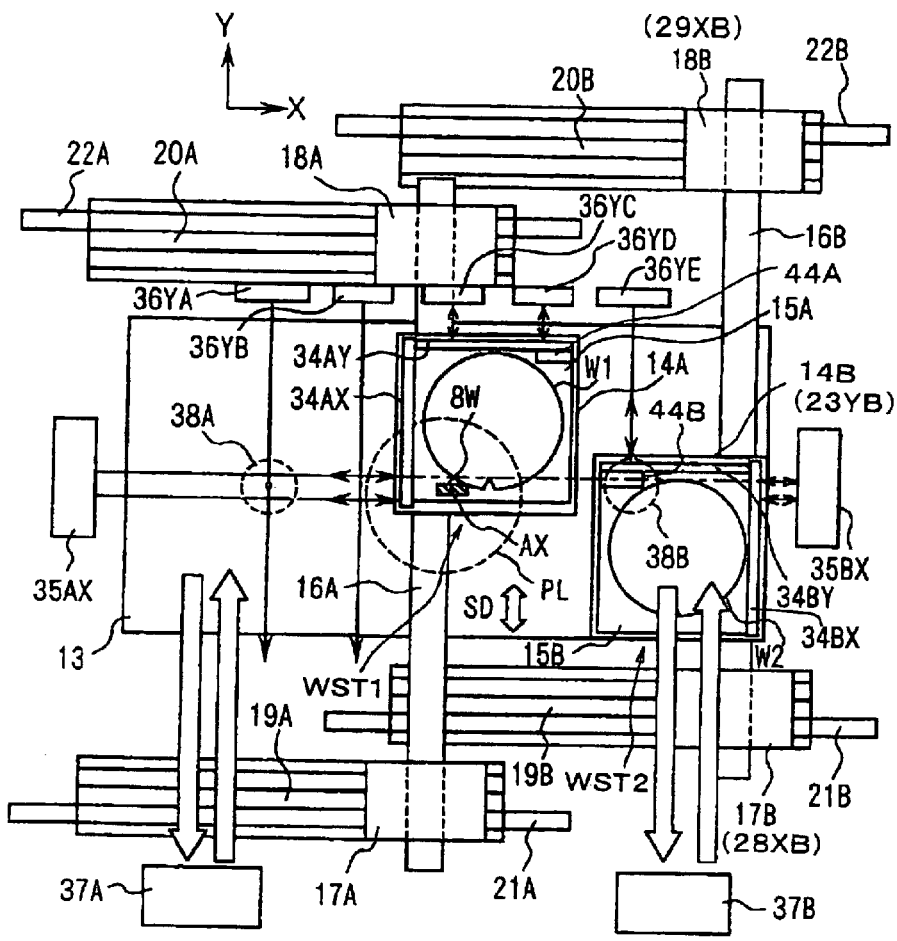
FIG. 2 shows a plan view illustrating a wafer stage system shown in FIG. 1.
Figure 3:
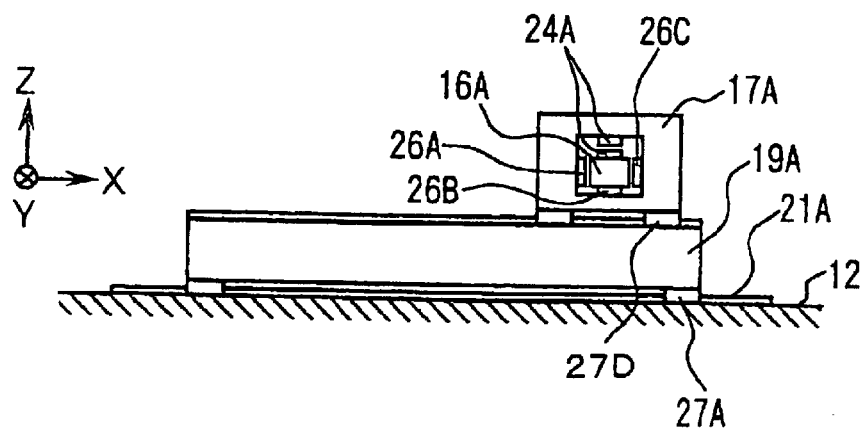
FIG. 3 shows a front view illustrating an X axis slider 19A and a Y axis linear guide 17A for a second wafer stage WST1 shown in FIG. 2.
Figure 4:
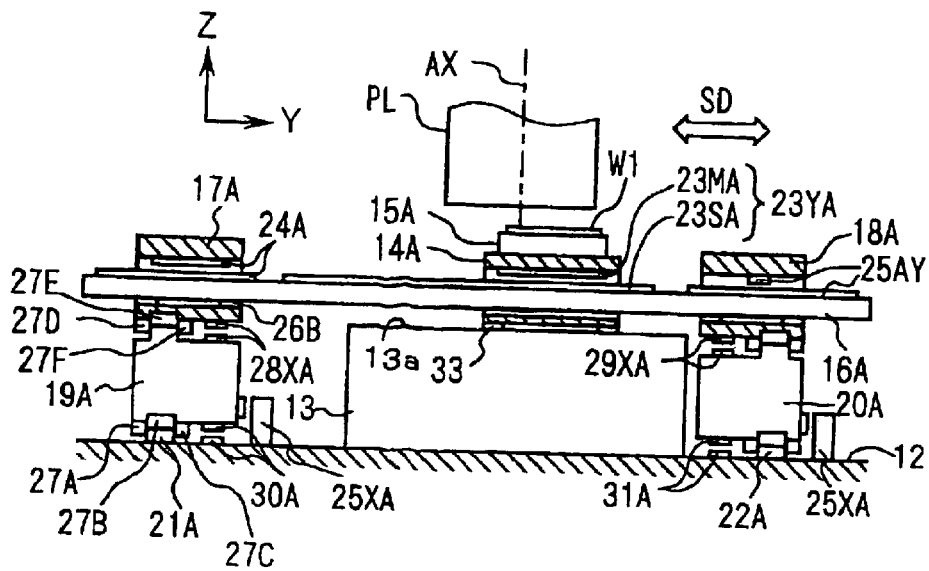
FIG. 4 shows, with partial cutaway, a side view illustrating a movable stage 14A, and Y axis linear guides 17A, 18A depicting a Y axis driving mechanism for a first wafer stage WST1 shown in FIG. 2.

FIG. 2 shows a plan view illustrating the wafer stage system shown in FIG. 1. FIG. 3 shows a front view illustrating a part of FIG. 2. FIG. 4 shows a side view with cross sections of the movable stage 14A and so forth shown in FIG. 2. As shown in FIG. 2, the wafer stage system of this embodiment is supported in a floating manner by the aid of air bearings over a guide surface 13a (see FIG. 4) on the wafer base 13. The wafer stage system comprises the two movable stages 14A, 14B which are independently movable in the X direction and the Y direction, the two sample bases 15A, 15B which are placed thereon, driving systems for these components, and an interferometer system for measuring the positions of these components. This arrangement will be described in further detail below. Air pads 33 (see FIG. 4), each of which is composed of, for example, a vacuum pre-loadable pneumatic bearing, are provided at a plurality of positions on the bottom surfaces of the movable stages 14A, 14B. The movable stages 14A, 14B are supported in a floating manner over the wafer base 13, for example, in a state in which a spacing distance of several $\mu$m is maintained in accordance with the balance between the vacuum pre-loaded pressure and the air-jetting force of the air pads.

With reference to FIG. 2, a pair of first X axis linear guides 21A, 22A are fixed in parallel to the X axis so that the wafer base 13 is interposed therebetween in the scanning direction SD (Y direction) during the scanning direction. A pair of second X axis linear guides 21B, 22B are fixed so that the wafer base 13 is interposed therebetween in the scanning direction SD at positions obtained by slightly deviating the X axis linear guides 21A, 21B in the +Y direction respectively. The X axis linear guides 21A, 22A, 21B, 22B are fixed on the base plate 12 shown in FIG. 1. First X axis sliders 19A, 20A (first slide members) are placed slidably in the X direction by the aid of air pads 27A to 27C (see FIG. 4) with respect to the X axis linear guides 21A, 22A. First frame-shaped Y axis linear guides 17A, 18A are placed slidably in the X direction by the aid of air pads 27D to 27F (see FIG. 4) on the X axis sliders 19A, 20A. A first Y axis slider 16A (second slide member) is arranged slidably in the Y direction by the aid of air pads 26A to 26C (see FIG. 3) at the inside of the Y axis linear guides 17A, 18A.

Figure 5:
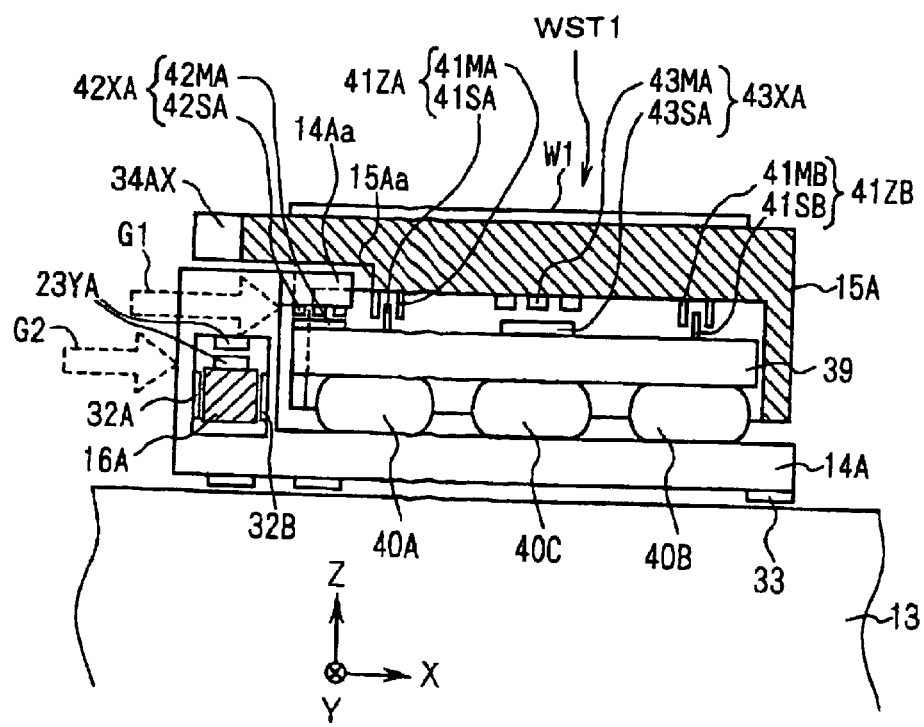
FIG. 5 shows, with partial cutaway, a Y axis slider 16A and a sample base 15A depicting the first wafer stage WST1 shown in FIG. 2.

As shown in FIG. 5 in which parts of the Y axis slider 16A, the movable stage 14A, the sample base 15A, and other components in FIG. 2 are cross-sectioned, the movable stage 14A is arranged slidably in the Y direction by the aid of air pads 32A, 32B with respect to the Y axis slider 16A. Further, as shown in FIG. 4, X axis linear motors 28XA, 29XA (first driving units) are arranged to drive the Y axis linear guides 17A, 18A and the Y axis slider 16A in the X direction with respect to the X axis sliders 19A, 20A respectively. A Y axis linear motor 23YA, which is composed of a stator 23SA comprising arranged permanent magnets and a rotator 23MA comprising a coil, is arranged to drive the movable stage 14A and other components in the Y direction with respect to the Y axis slider 16A.

In this arrangement, the X axis sliders 19A, 20A are supported movably in the X direction with respect to the X axis linear guides 21A, 22A. Therefore, the X axis linear motors 28XA, 29XA relatively drive, in the X direction, the movable section including the Y axis linear guides 17A, 18A, the Y axis slider 16A, the movable stage 14A, the sample base 15A, and the wafer W1 in a state in which the law of conservation of momentum is substantially satisfied with respect to the X axis sliders 19A, 20A. In order to avoid any gradual deviation of the positions of the X axis sliders 19A, 20A during this process, as shown in FIG. 4, a linear encoder 25XA is arranged as a position-measuring unit for measuring the positions in the X direction of the X axis sliders 19A, 20A with respect to the base plate 12. Linear motors 30A, 31A are also arranged as position-correcting driving units for driving the X axis sliders 19A, 20A in the X direction with respect to the base plate 12.

Similarly, the Y axis slider 16A is supported movably in the Y direction with respect to the Y axis linear guides 17A, 18A. Therefore, the Y axis linear motor 23YA relatively drives, in the Y direction, the movable section including the movable stage 14A, the sample base 15A, and the wafer W1 in a state in which the law of conservation of momentum is substantially satisfied with respect to the Y axis slider 16A. In order to avoid any gradual deviation of the position of the Y axis slider 16A during this process, as shown in FIG. 4, a linear encoder 25AY is arranged as a position-measuring unit for measuring the positions in the Y direction of the Y axis slider 16A with respect to the first Y axis linear guide 18A. A linear motor 24A is also arranged as a position-correcting driving unit for driving the Y axis slider 16A in the Y direction with respect to the second Y axis linear guide 17A.

With reference to FIG. 2 again, second X axis sliders 19B, 20B (third slide members) are placed slidably in the X direction by the aid of air pads with respect to the second X axis linear guides 21B, 22B. Second Y axis linear guides 17B, 18B are placed slidably in the X direction by the aid of air pads on the X axis sliders 19B, 20B. A second Y axis slider 16B (fourth slide member) is arranged slidably in the Y direction by the aid of air pads at the inside of the Y axis linear guides 17B, 18B. The second movable stage 14B is arranged slidably in the Y direction by the aid of air pads with respect to the Y axis slider 16B.

In this arrangement, the following assumption may be also affirmed. That is, the first wafer stage WST1 is constructed by the movable stage 14A, the sample base 15A, and other components. The second wafer stage WST2 is constructed by the movable stage 14B, the sample base 15B, and other components. The first wafer stage WST1 (movable stage 14A) and the second wafer stage WST2 (movable stage 14B) substantially have principal movable areas of a half surface on the side in the −X direction and a half surface on the side in the +X direction on the wafer base 13 respectively, in addition to the exposure area of the projection optical system PL. The Y axis sliders 16A, 16B are arranged on the outer sides so that they are farthest from each other with respect to the movable stages 14A, 14B. Accordingly, there is no fear of mechanical interference between the two Y axis sliders 16A.

A fiducial mark member 44A, on which a fiducial mark for measuring the baseline for an alignment sensor 38A is formed, is fixed to the upper surface of the first sample base 15A on the side in the +X direction. A fiducial mark member 44B, on which a fiducial mark for measuring the baseline for an alignment sensor 38B is formed, is fixed to the upper surface of the second sample base 15B on the side in the −X direction. The fiducial mark members 44A, 44B are fixed at the inside as described above. Accordingly, the baseline measurement can be performed for the alignment sensor 38A or 38B on the other wafer stage during the exposure on one of the wafer stages WST1, WST2.

X axis linear motors 28XB, 29XB (third driving units) are arranged to relatively drive the Y axis linear guides 17B, 18B, the Y axis slider 16B, and other components in the X direction while substantially satisfying the law of conservation of momentum with respect to the X axis sliders 19B, 20B respectively. A Y axis linear motor 23YB (fourth driving unit) is also arranged to relatively drive the movable stage 14B, the sample base 15B, the wafer W2, and other components in the Y direction in a state in which the law of conservation of momentum is substantially satisfied with respect to the Y axis slider 16B. Further, a position-measuring unit and a position-correcting driving unit (not shown) are also arranged to correct the positions in the X direction of the Y axis linear guides 17B, 18B and the position in the Y direction of the Y axis slider 16B respectively.

Further, a first wafer loader system 37A is arranged in front of the wafer base 13 in the −X direction to deliver the wafer with respect to the sample base 15A of the first wafer stage WST1. A second wafer loader system 37B is arranged in front of the wafer base 13 in the +X direction to deliver the wafer with respect to the sample base 15B of the second wafer stage WST2. Owing to this arrangement, for example, the following procedure can be executed. That is, the first movable stage 14A is driven to move the wafer W1 (sample base 15A) to a position in the vicinity of the slit-shaped exposure area 8W brought about by the projection optical system PL, and then the movable stage 14A is driven in the scanning direction SD to perform the scanning exposure for the wafer W1, during which the second movable stage 14B is moved to a position in front of the second wafer loader system 37B to exchange the wafer on the second sample base 15B, and then the alignment (search alignment and fine alignment) is executed for the wafer after the exchange by using the alignment sensor 38B.

As described above, in this embodiment, the X axis sliders 19A, 20A and the Y axis slider 16A as the guide members for the first driving system for driving the first wafer stage WST1 (movable stage 14A) in the X direction and the Y direction, and the X axis sliders 19B, 20B and the Y axis slider 16B as the guide members for the second driving system for driving the second wafer stage WST2 (movable stage 14B) in the X direction and the Y direction are arranged independently from each other. Accordingly, the reaction forces, which are generated when the two wafer stages WST1, WST2 (movable stages 14A, 14B) are driven, are dealt with independently from each other. Therefore, when the two wafer stages are driven two-dimensionally, the influence of one of them, which is caused, for example, by the reaction force during the acceleration or the deceleration, is not exerted mutually on the other. Therefore, the exposure accuracy is not deteriorated. It is possible to execute the exposure operation and the alignment operation with a high throughput completely in parallel by using the two wafer stages. Further, the movable stages 14A, 14B are driven in the X direction and the Y direction while substantially satisfying the law of conservation of momentum respectively. Therefore, an advantage is also obtained such that the vibration, which is caused by these stages, does not exert any harmful influence, for example, on the projection optical system PL and the reticle stage system.

Next, explanation will be made with reference to FIG. 2 for an exemplary measuring system of the wafer stage system of this embodiment. With reference to FIG. 2, an X axis movement mirror 34AX and a Y axis movement mirror 34AY are fixed to side surfaces in the −X direction and the +Y direction of the sample base 15A of the first wafer stage WST1. An X axis movement mirror 34BX and a Y axis movement mirror 34BY are fixed to side surfaces in the +X direction and the −Y direction of the sample base 15B of the second wafer stage WST2, respectively. In place of the use of, for example, the movement mirrors 34AX, 34AY as described above, the side surfaces of the sample bases 15A, 15B may be mirror-finished, and measuring laser beams may be radiated onto obtained mirror surface portions.

In this embodiment, the optical axis AX of the projection optical system PL (center of the exposure area 8W), the optical axis of the first alignment sensor 38A (detection center), and the optical axis of the second alignment sensor 38B (detection center) are arranged on a straight line which is parallel to the X axis. Two measuring beams having an axis of symmetry, which is parallel to the X axis and passes through the optical axis AX, are radiated from a laser interferometer 35AX in the −X direction onto the X axis movement mirror 34AX of the first wafer stage WST1 (sample base 15A). Symmetrically therewith, two measuring beams having an axis of symmetry which is parallel to the X axis and passes through the optical axis AX are radiated from a laser interferometer 35BX in the +X direction onto the X axis movement mirror 34BX of the second wafer stage WST2 (sample base 15B). In addition to the two sets of the measuring beams, measuring beams, which are separated in the Z direction, are actually radiated onto the movement mirrors 34AX, 34BX. The laser interferometers 35AX, 35BX measure the positions in the X direction, the angles of rotation about the Z axis (yawing amounts), and the angles of rotation about the Y axis (rolling amounts) of the wafer stages WST1, WST2 respectively.

A measuring beam, which passes through the optical axis AX and which is parallel to the Y axis, is radiated from a laser interferometer 36YC onto the Y axis movement mirror 34AY of the first wafer stage WST1. Further, laser interferometers 36YA, 36YE, which have measuring beams passing through the detection centers of the alignment sensors 38A, 38B respectively and being parallel to the Y axis respectively, are also provided. In the case of this embodiment, measured values obtained by the central laser interferometer 36YC are used to measure the positions in the Y direction of the wafer stages WST1, WST2 (sample bases 15A, 15B) during the exposure based on the use of the projection optical system PL. A measured value obtained by each of the laser interferometers 36YA, 36YE is used to measure the position in the Y direction of the wafer stage WST1 or WST2 during the use of the alignment sensor 38A or 38B.

Therefore, any one of the measuring beams of the Y axis laser interferometers 36YA, 36YC, 36YE is deviated from the movement mirror 34AY, 34BY of the wafer stage WST1, WST2 in some cases, for example, depending on each of the conditions of use, or when the operation is changed from the alignment operation to the exposure operation. Accordingly, in this embodiment, a laser interferometer 136YB, which has a measuring beam parallel to the Y axis, is provided between the laser interferometers 36YA and 36YC. A laser interferometer 36YD, which has a measuring beam parallel to the Y axis, is provided between the laser interferometers 36YC and 36YE. Accordingly, the measuring beam from at least one of the laser interferometers is always radiated onto the movement mirror 34AY, 34BY of the wafer stage WST1, WST2. For this purpose, assuming that the width of the movement mirror 34AY, 34BY in the X direction (substantially equal to the width of the sample base 15A, 15B in the X direction) is DX1, the spacing distance DX2 in the X direction between the measuring beams from the respective laser interferometers 36YA to 36YE is set to be narrower than DX1. As a result, a situation is necessarily occurs, in which the adjoining two measuring beams of the foregoing measuring beams are simultaneously radiated onto the movement mirror 34AY, 34BY. Therefore, the measured value is delivered in this state from the first laser interferometer to the second laser interferometer.

Specifically, a case is exemplified, in which the first wafer stage WST1 is moved in the −X direction starting from the state shown in FIG. 2. In this case, an offset is added to the measured value of the next laser interferometer 36YC so that the measured value of the next laser interferometer 36YC coincides with the measured value of the laser interferometer 36YD which has been previously used, in a state in which the yawing amount of the wafer stage WST1 measured by the laser interferometer 35AX is zero. Accordingly, the measured value of the position in the Y direction can be correctly delivered between the laser interferometers 36YD and 36YC. The movement mirrors 34AY, 34BY and consequently the wafer stages WST1, WST2 can be miniaturized to have a light weight by delivering the measured values of the plurality of laser interferometers 36YA to 36YE which are arranged in the X direction as described above. As a result, the wafer stages WST1, WST2 can be driven highly accurately at a high speed.

Each of the measuring beams from the laser interferometers 36YA to 36YE for measuring the position in the Y direction is also composed of two-axis laser beams capable of independently measuring the position while being separated from each other in the Z direction. Therefore, the laser interferometers 36YA, 36YE can also measure the angles of rotation about the X axis (pitching amounts), in addition to the positions in the Y direction of the movement mirrors 34AY, 34BY as the measurement objectives respectively. In this embodiment, a total of seven interferometers, i.e., the laser interferometers 35AX, 35BX, 36YA to 36YE are used to construct the interferometer system for managing the two-dimensional coordinate positions and the angles of rotation about the three axes of the wafer stages WST1, WST2. In this embodiment, as described above, one of the wafer stages WST1, WST2 executes the exposure sequence, during which the other executes the sequence of wafer exchange and wafer alignment. During this process, the positions and the velocities of the wafer stages WST1, WST2 are controlled on the basis of the measured values of the respective laser interferometers so that no mechanical interference is caused between the both stages.

Next, explanation will be made with reference to FIGS. 5 to 7 for the mechanism for the leveling and the focusing for the wafer stage system of this embodiment.

FIG. 5 shows a front view illustrating the first wafer stage WST1 with cross sections of the Y axis slider 16A and the sample base 15A shown in FIG. 2. With reference to FIG. 5, the movable stage 14A, which has a substantially L-shaped cross-sectional configuration and which has a projection 14Aa formed at an upper portion, is placed slidably in the X direction and the Y direction on the guide surface of the wafer base 13 by the aid of the air pads 33. The Y axis slider 16A is arranged movably in parallel to the Y axis by the aid of the air pads 32A, 32B at the inside of the movable stage 14A. The Y axis linear motor 23YA is arranged to drive the movable stage 14A in the Y direction (scanning direction) while substantially satisfying the law of conservation of momentum with respect to the Y axis slider 16A. As having been explained, the movable stage 14A is driven in the X direction (non-scanning direction) by the aid of the X axis linear motors 28XA, 29XA shown in FIG. 4 together with the Y axis slider 16A.

A substantially flat plate-shaped intermediate plate 39, which serves as a buffer member, is arranged on the movable stage 14A in a state of being not restrained mechanically by the aid of the three air dampers 40A to 40C which serve as gas-based vibration-preventive members. Each of the air dampers 40A to 40C includes the gas such as dry air, nitrogen gas, and helium gas enclosed to have a predetermined gas pressure in a bag-shaped container composed of an elastic member such as synthetic rubber and synthetic resin with high air-tightness and flexibility. The gas is always supplied into the container from an unillustrated gas source via unillustrated flexible piping so that the internal gas pressure maintains a predetermined gas pressure. As shown in FIG. 7, the air dampers 40A to 40C are arranged so that they are located at apexes of an isosceles triangle to cover the bottom surface portion of the intermediate plate 39 substantially uniformly.

With reference to FIG. 5, the sample base 15A is arranged in a non-contact state with respect to the movable stage 14A and the intermediate plate 39 so that the intermediate plate 39 is covered therewith at upward portions and side surfaces. The wafer W1 is held on the sample base 15A by means of, for example, vacuum attraction by the aid of an unillustrated wafer holder. In this arrangement, the positional relationship between the movable stage 14A and the sample base 15A is set so that a recess 15Aa, which is disposed on the side in the −X direction of the bottom surface of the sample base 15A, substantially covers the projection 14Aa of the movable stage 14A.

An X axis actuator 42XA (first driving unit based on the non-contact system) based on the linear motor system for driving the intermediate plate 39 in the X direction with respect to the movable stage 14A is constructed by a stator 42SA composed of a permanent magnet array fixed on the projection 14Aa of the movable stage 14A and a rotator 42MA composed of a coil fixed on the end portion in the −X direction of the intermediate plate 39. Further, an X axis actuator 43XA (second driving unit based on the non-contact system) based on the linear motor system for driving the sample base 15A in the X direction with respect to the intermediate plate 39 is constructed by a rotator 43MA composed of a permanent magnet array fixed on the bottom surface of the sample base 15A and a stator 43SA composed of a coil fixed on the central portion of the intermediate plate 39.

Figure 6:
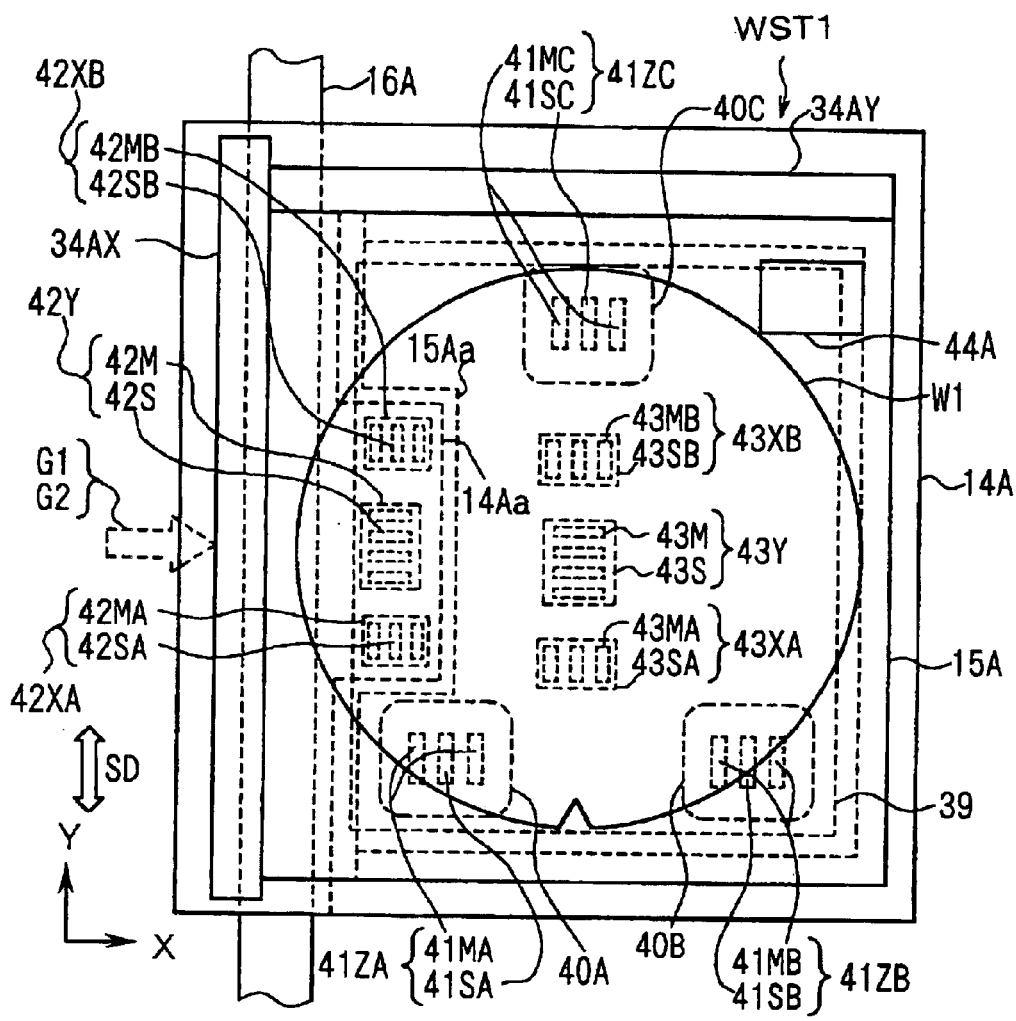
FIG. 6 shows a magnified plan view illustrating the first wafer stage WST1 shown in FIG. 2.

FIG. 6 shows a plan view illustrating the first wafer stage WST1. As shown in FIG. 6, an X axis actuator 42XB based on the linear motor system, which is composed of a stator 42SB and a rotator 42MB, is provided in parallel to the X axis actuator 42XA between the projection 14Aa of the movable stage 14A and the intermediate plate 39. A Y axis actuator 42Y based on the linear motor system, which is composed of a stator 42S and a rotator 42M to drive the intermediate plate 39 in the Y direction with respect to the movable stage 14A, is provided between the two X axis actuators 42XA, 42XB.

Figure 7:
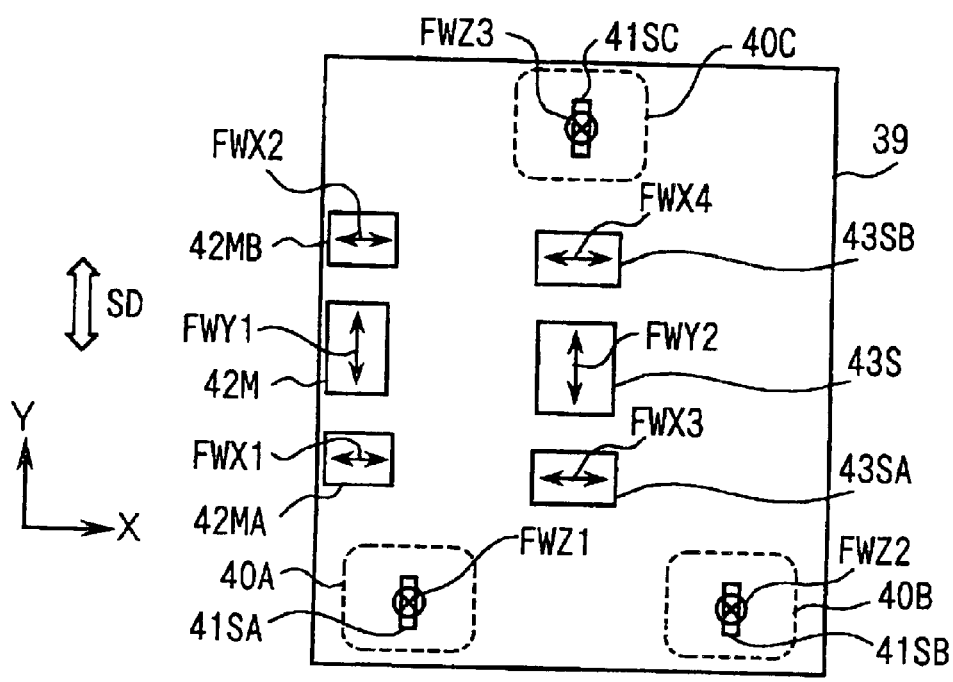
FIG. 7 shows a plan view illustrating an intermediate plate 39 shown in FIG. 5.

As shown in FIG. 7 which shows a plan view of the intermediate plate 39, the thrust forces FWX1, FWX2 in the X direction are exerted on the X axis rotators 42MA, 42MB on the side of the intermediate plate 39 respectively, and the thrust force FWY1 in the Y direction is exerted on the Y axis rotator 42M on the side of the intermediate plate 39, by the X axis actuators 42XA, 42XB and the Y axis actuator 42Y. The intermediate plate 39 can be rotated about the Z axis in accordance with the difference between the thrust forces FWX1, FWX2 in the X direction. Therefore, the intermediate plate 39 can be relatively driven in the X direction, the Y direction, and the direction of rotation with respect to the movable stage 14A.

In this arrangement, the X axis actuators 42XA, 42XB and the Y axis actuator 42Y are used in order that the retaining force is given so that the intermediate plate 39 is moved while substantially following the movable stage 14A, and the thrust force is given so that the position of the sample base 15A is finely adjusted two-dimensionally by the aid of the intermediate plate 39, when the movable stage 14A is driven in the Y direction with respect to the Y axis slider 16A, or when the Y axis slider 16A and the movable stage 14A are driven in the X direction. When the thrust force is applied to the intermediate plate 39 in order to finely adjust the position of the sample base 15A two-dimensionally as described above, the movable stage 14A and the intermediate plate 39 are moved two-dimensionally so that the law of conservation of momentum is substantially satisfied in accordance with the buffering action of the air dampers 40A to 40C. Therefore, the influence of vibration is not exerted to the outside.

In order to satisfy the law of conservation of momentum as described above, with reference to FIG. 5, it is desirable that the position of the center of gravity G2 of the movable stage 14A in the Z direction is disposed as closely as possible to the position of the center of gravity G1 of the intermediate plate 39 and the sample base 15A in the Z direction. Further, with reference to FIG. 6, it is desirable that the position of the center of gravity G2 of the movable stage 14A in the Y direction is disposed as closely as possible to the position of the center of gravity G1 of the intermediate plate 39 and the sample base 15A in the Y direction. In this embodiment, the both are substantially coincident with each other.

Further, the air dampers 40A to 40C have the self-restoring function to make restoration to the original position when the external force disappears. Therefore, the positional relationship of the intermediate plate 39 with respect to the movable stage 14A can be easily restored to the center of the relative movable range by making the thrust forces of the actuators 42XA, 42XB, 42Y to be zero.

With reference to FIG. 6, an X axis actuator 43XB based on the linear motor system, which is composed of a stator 43SB and a rotator 43MB, is provided in parallel to the X axis actuator 43XB between the bottom surface of the sample base 15A and the central portion of the intermediate plate 39. A Y axis actuator 43Y based on the linear motor system, which is composed of a stator 43S and a rotator 43M to drive the sample base 15A in the Y direction with respect to the intermediate plate 39, is provided between the two X axis actuators 43XA, 43XB.

As shown in FIG. 7, the thrust forces FWX3, FWX4 in the X direction are exerted on the sample base 15A from the X axis stators 43SA, 43SB on the side of the intermediate plate 39 respectively, and the thrust force FWY2 in the Y direction is exerted on the sample base 15A from the Y axis stator 43S on the side of the intermediate plate 39, by means of the X axis actuators 43XA, 43XB and the Y axis actuator 43Y. The sample base 15A can be rotated about the Z axis in accordance with the difference between the thrust forces FWX3, FWX4 in the X direction. Therefore, the sample base 15A shown in FIG. 6 can be relatively driven in the X direction, the Y direction, and the direction of rotation with respect to the intermediate plate 39. The X axis actuators 43XA 43XB and the Y axis actuator 43Y are principally used to apply the retaining force so that the sample base 15A is allowed to substantially stand still in a relative manner in the X direction, the Y direction, and the direction of rotation with respect to the intermediate plate 39. Accordingly, the sample base 15A and the intermediate plate 39 are moved substantially in an integrated manner in the plane perpendicular to the Z axis. However, the position of the sample base 15A with respect to the intermediate plate 39 (and further with respect to the movable stage 14A) may be finely adjusted by using the actuators 43XA, 43XB, 43Y.

In this arrangement, the position of the sample base 15A is highly accurately measured by means of the laser interferometers. Therefore, in order to measure the relative positions of the sample base 15A and the intermediate plate 39, three small-sized unillustrated linear encoders (relative position-measuring units) based on the optical system or the like are provided. The control is made so that the relative displacement amount of the sample base 15A with respect to the intermediate plate 39 is always within an allowable range, on the basis of measured values obtained by the linear encoders. However, in place of the use of the relative position-measuring units as described above, for example, three small-sized air dampers having the self-restoring function may be installed between the intermediate plate 39 and the sample base 15A.

As shown in FIG. 5, a first Z axis actuator 41ZA (third driving unit based on the non-contact system) based on the voice coil motor system, which is composed of a rotator 41MA including a permanent magnet and a stator 41SA including a coil and which applies the thrust force FWZ1 (see FIG. 7) in the Z direction to the sample base 15A with respect to the intermediate plate 39, is arranged between the upper surface of the intermediate plate 39 and the bottom surface of the sample base 15A. As shown in FIGS. 6 and 7, a second Z axis actuator 41ZB (stator 41SB, rotator 41MB) and a third Z axis actuator 41ZC (stator 41SC, rotator 41MC), which generate the thrust forces FWZ2, FWZ3 in the Z direction for the sample base 15A with respect to the intermediate plate 39 respectively, are also arranged in parallel to the first Z axis actuator 41ZA between the intermediate plate 39 and the sample base 15A. The Z axis actuators 41ZA to 41ZC are arranged over the air dampers 40A to 40C respectively. The sample base 15A can be displaced in the Z direction in accordance with the non-contact system with respect to the intermediate plate 39 to perform the focusing, and the angles of inclination about the two axes, i.e., about the X axis and the Y axis can be corrected to perform the leveling, by controlling the thrust forces in the Z direction of the three Z axis actuators 41ZA to 41ZC. This arrangement is also adopted in an equivalent manner for the side of the second wafer stage WST2.

As described above, when the sample base 15A is driven in the Z direction with respect to the intermediate plate 39, or when the sample base 15A is inclined with respect to the intermediate plate 39, the intermediate plate 39 and the sample base 15A are displaced so that the law of conservation of momentum is substantially satisfied in accordance with the action of the air dampers 40A to 40C. The influence of vibration is not exerted to the outside via the movable stage 14A. Therefore, the high exposure accuracy is maintained.

In this embodiment, the intermediate plate 39 is arranged displaceably within a certain degree of range in the X direction, the Y direction, and the Z direction and rotatably within a certain degree of range about the X axis, the Y axis, and the Z axis, i.e., displaceably in the directions of six axes on the movable stage 14A by the aid of the air dampers 40A to 40C. The sample base 15A is arranged displaceably in the directions of six axes in the non-contact state with respect to the intermediate plate 39. The wafer W1 is held on the sample base 15A. Therefore, the sample base 15A (wafer W1) can be displaced in the directions of six axes in the state in which the law of conservation of momentum is substantially satisfied by the aid of the intermediate plate 39 with respect to the movable stage 14A. It is possible to remarkably decrease the influence of vibration, for example, on the projection optical system PL and the reticle stage system as other components. Further, the sample base 15A, which is the actually driven portion, can be miniaturized to have a light weight. Therefore, it is possible to highly accurately perform, at a high speed, the fine adjustment for the two-dimensional position, the focusing, and the leveling for the sample base 15A (wafer W1).

Next, explanation will be made with reference to FIG. 8 for a control system for the wafer stage system of this embodiment.

Figure 8:
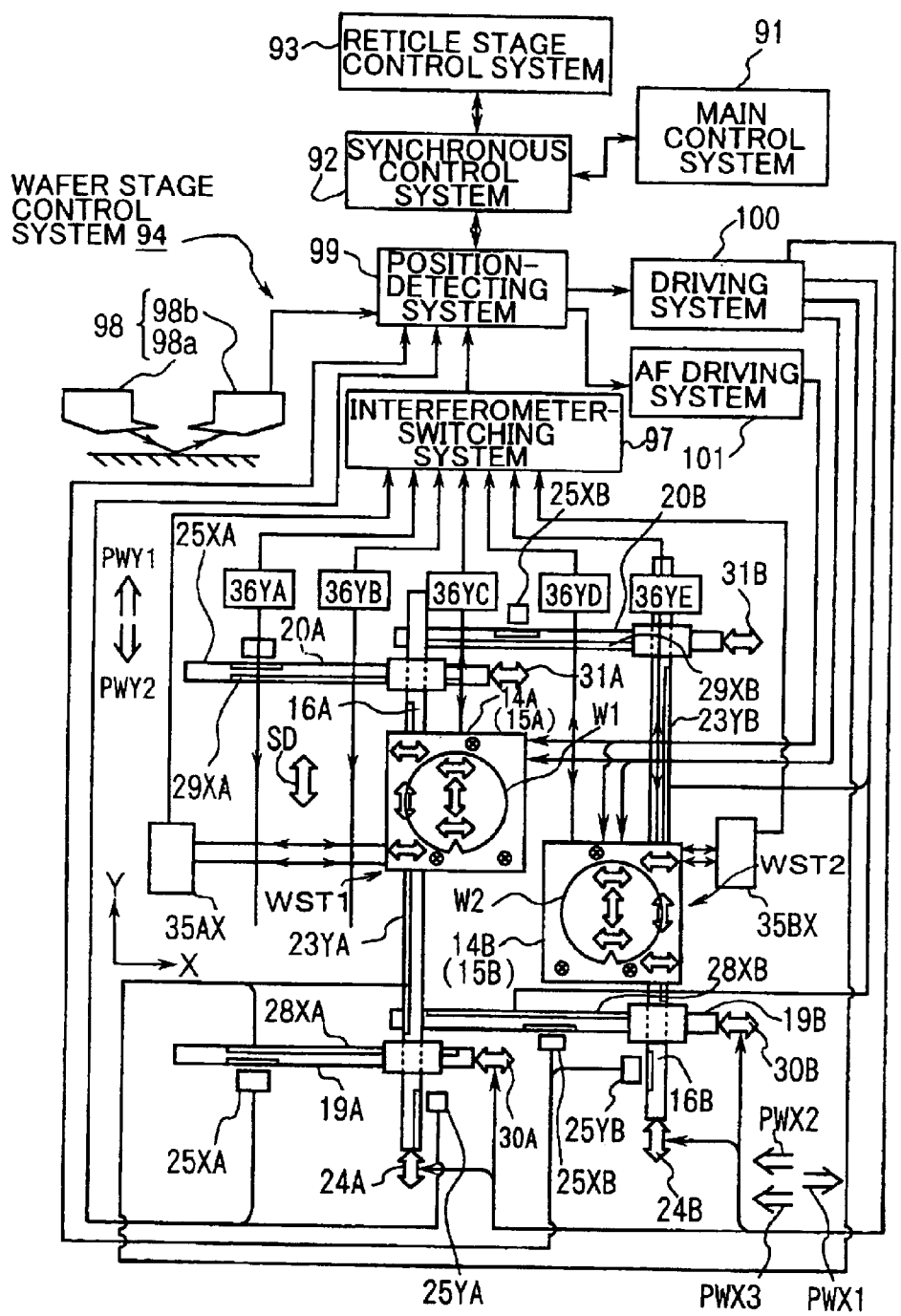
FIG. 8 shows a block diagram illustrating a control system for the wafer stage system according to the embodiment.

FIG. 8 shows the control system for the wafer stage system of this embodiment. With reference to FIG. 8, a synchronous control system 92 is connected to a main control system 91 which is composed of a computer for collectively controlling the operation of the entire apparatus. A reticle stage control system 93 for controlling the operation of the reticle stage system and a wafer stage control system 94 for controlling the operation of the wafer stage system are connected to the synchronous control system 92. The synchronous control system 92 supplies, for example, various pieces of timing information so that the operations of the reticle stage control system 93 and the wafer stage control system 94 are synchronized with each other during the scanning exposure under the control of the main control system 91.

The wafer stage control system 94 includes an interferometer-switching system 97 which incorporates the measured values from the seven laser interferometers 35AX, 35BX, 36YA to 36YE de scribed above and which delivers and switches the measured values of the Y axis laser interferometers 36YA to 36YE, and a position-detecting system 99 to which the measured values of the coordinates of the sample bases 15A, 15B of the wafer stages WST1, WST2 are supplied from the interferometer-switching system 97. The measured values of the positions of the Y axis sliders 16A, 16B obtained by the linear encoders 25YA, 25YB, the measured values of the positions of the X axis sliders 19A, 20A obtained by the linear encoder 25XA, and the measured values of the positions of the X axis sliders 19B, 20B obtained by the linear encoder 25XB are also supplied to the position-detecting system 99.

Further, this embodiment is provided with an autofocus sensor (hereinafter referred to as "AF sensor") 98 for detecting the defocus amount of the exposure plane of the wafer W1 (or W2) with respect to the best focus position of the projection optical system PL. A multi-point AF system based on the so-called oblique incidence system, which has a projecting system 98a for projecting a plurality of slit images onto the exposure plane and a light-receiving system 98b for collecting reflected light from the exposure plane to form the slit images again, is used as the AF sensor 98. Signals, which indicate defocus amounts at a plurality of measuring points from the light-receiving system 98b, are supplied to the position-detecting system 99.

The position-detecting system 99 processes the defocus amounts to calculate an average defocus amount of the exposure plane and a discrepancy amount of the angle of inclination about the two axis (i.e., about the X axis and the Y axis). The Z axis actuators 41ZA to 41ZC for the first wafer stage WST1 shown in FIG. 6 or the corresponding Z axis actuators for the second wafer stage WST2 are driven by the aid of an AF driving system 101 so that the defocus amount and the discrepancy amount of the angle of inclination are included within allowable ranges. Accordingly, the focusing and the leveling are performed highly accurately in accordance with the autofocus system.

The operations are controlled in parallel by the driving system 100 for the X axis linear motors 28XA, 29XA and the Y axis linear motor 23YA for driving the first wafer stage WST1 in the X direction and the Y direction, the X axis linear motors 28XB, 29XB and the Y axis linear motor 23YB for driving the second wafer stage WST2 in the X direction and the Y direction, the linear motors 30A, 31A, 24A for correcting the positions of the X axis sliders 19A, 20A and the Y axis slider 16A on the side of the first wafer stage WST1 respectively, and the linear motors 30B, 31B, 24B for correcting the positions of the X axis sliders 19B, 20B and the Y axis slider 16B on the side of the second wafer stage WST2 respectively. Further, the respective operations are also controlled in parallel by the driving system 100 for the actuators 42XA, 42XB, 42Y and the actuators 43XA, 43XB, 43Y for finely driving the sample base 15A of the first wafer stage WST1 shown in FIG. 6, and the corresponding actuators for finely driving the sample base 15B of the second wafer stage WST2.

With reference to FIG. 8, the main control system 91 supplies information on the target velocity and the target position of the sample base 15A to the position-detecting system 99 by the aid of the synchronous control system 92 during the scanning exposure in which the sample base 15A (wafer W1) of the first wafer stage WST1 is scanned at a constant velocity in the scanning direction SD (Y direction). Further, if necessary, the main control system 91 supplies, to the position-detecting system 99, information on the corrected value of the relative position of the sample base 15A with respect to the movable stage 14A, the target position of the Y axis slider 16A in the Y direction, and the target positions of the X axis sliders 19A, 20A in the X direction.

In response thereto, the position-detecting system 99 detects the error of the velocity and the position of the sample base 15A, and for example, the positional discrepancy amount of the sample base 15A from the center of the movable range with respect to the movable stage 14A. For example, the Y axis linear motor 23YA and the X axis linear motors 28XA, 29XA are driven by the aid of the driving system so that the error and the positional discrepancy amount are included within allowable ranges. Accordingly, the sample base 15A and the wafer W1 disposed thereon are scanned at the constant velocity in the +Y direction or the −Y direction. During this process, when the wafer stage WST1 is moved in the Y direction with a momentum PWY1, the Y axis slider 16A is moved in the opposite direction with a momentum PWY2, wherein the following relationship holds in accordance with the law of conservation of momentum.

$$PWY1 = PWY2 \tag{1}$$

However, when the scanning exposure is performed for a large number of shot areas arranged at predetermined pitches in the X direction and the Y direction on the wafer W1, for example, the scanning exposure is performed for each of a plurality of columns as follows. That is, a plurality of shot areas arranged on the first column in the X direction are subjected to the exposure. Subsequently, the wafer W1 is moved in the Y direction in the stepping manner, and then a plurality of shot areas arranged on the second column are subjected to the exposure. When the scanning exposure is performed for the plurality of shot areas on each of the columns, the exposure is performed while successively changing the scanning direction between the +Y direction and the −Y direction every time when the operation is advanced to the adjoining shot area. Therefore, during the exposure for each of the columns, the Y axis slider 16A performs only the reciprocating motion in the Y direction, in which its average position is substantially identical. However, the law of conservation of momentum in the Y direction also holds when the wafer stage WST1 is moved in the Y direction in the stepping manner. Therefore, when the wafer W1 is moved in the Y direction in the stepping manner to advance the operation from a certain column to the next column, it is feared that the position of the Y axis slider 16A in the Y direction is gradually deviated in the Y direction, and the position is excluded from the movable range.

In such a case, for example, the position of the Y axis slider 16A is restored by using the position-correcting linear motor 24A by the aid of the driving system 100 during the period (column-to-column migration period) in which the operation is advanced to the next column on the wafer W1. Accordingly, the exposure can be continuously performed for the shot areas disposed over the entire surface of the wafer W1 in a state in which the Y axis slider 16A is always included within the movable range while still allowing the Y axis slider 16A to have the necessary minimum length.

When the wafer stage WST1 is moved in the X direction in the stepping manner, then the wafer stage WST1, the Y axis slider 16A, and other components are moved in the X direction with a momentum PWX1, the X axis sliders 19A, 20A are moved with momentums PWX1, PWX3, and the following relationship holds in accordance with the law of conservation of momentum.

$$PWX1=PWX2+PWX3 \quad (2)$$

Accordingly, it is feared that the X axis sliders 19A, 20A are gradually moved in the X direction, and they are excluded from the movable ranges. Also in such a case, the exposure can be continuously performed without lengthening the X axis sliders 19A, 20A so much, i.e., without increasing the size of the wafer stage system, by correcting the positions of the X axis sliders 19A, 20A by using the position-correcting linear motors 30A, 31A by the aid of the driving system 100.

Similarly, also when the second wafer stage WST2 is used, the scanning exposure can be performed in a state in which the law of conservation of momentum is satisfied.

When the scanning exposure is performed for the wafer on one of the first wafer stage WST1 and the second wafer stage WST2, while the wafer exchange or the wafer alignment is executed on the other wafer stage, then the other wafer stage is driven so that the law of conservation of momentum is satisfied in the same manner as described above. Therefore, the one wafer stage, on which the scanning exposure is performed, can be prevented from any decrease in exposure accuracy.

In the embodiment described above, the X axis sliders 19A, 20A, which are provided to drive the wafer stage WST1 shown in FIG. 2 in the X direction (non-scanning direction), are arranged to interpose the movable stage 14A in the Y direction. When the driving is effected in the scanning direction, it is enough that only the wafer stage WST1 is driven along the single Y axis slider 16A. Therefore, the load during the scanning exposure is mitigated, and it is possible to perform the scanning exposure highly accurately at a high speed.

However, a plurality of (for example, two) Y axis sliders may be provided in place of the single Y axis slider 16A. The movable stage 14A may be driven in the Y direction (scanning direction) along the plurality of Y axis sliders.

As for the wafer stage WST1 shown in FIG. 5, the air dampers 40A to 40C, which serve as the vibration-preventive members, are arranged on the bottom surface side of the intermediate plate 39. Each of the air dampers 40A to 40C has a light weight. Therefore, an advantage is obtained such that the law of conservation of momentum is satisfied at the inside, and the light weight can be realized. However, when it is allowed that the weight is increased to some extent, a vibration-preventive member based on the liquid system such as an oil damper may be used in place of the air damper 40A to 40C. Further, an electromagnetic damper having a position-measuring function may be used as the vibration-preventive member.

Further, as for the wafer stage WST1 shown in FIG. 5, the intermediate plate 39 (buffer member) is arranged between the movable stage 14A and the sample base 15A. Therefore, it is possible to realize a light weight of the sample base 15A which is driven in order to perform, for example, the leveling. However, in order to simplify the arrangement, the sample base 15A and the intermediate plate 39 may be integrated into one unit. In this case, for example, three Z axis actuators 41ZA to 41ZC may be arranged between the bottom surface of the intermediate plate 39 and the upper surface of the movable stage 14A. The leveling and the focusing may be performed by using these actuators.

In the embodiment described above, those usable as the X axis actuator 42XA or the like shown in FIG. 6 include, for example, a linear motor as well as an actuator based on the EI core system, an actuator based on the use of the Lorentz force, and a voice coil motor. Further, those usable as the Z axis actuators 41ZA to 41ZC include, for example, a voice coil motor as well as an actuator based on the EI core system, and an actuator based on the use of the magnetic attractive force or repulsive force.

In the wafer stage system shown in FIG. 2, the reaction force is offset by satisfying the law of conservation of momentum in the X direction and the Y direction, and hence the influence of vibration to the outside is decreased. However, for example, as for the first X axis sliders 19A, 20B and the second X axis sliders 19B, 20B in the X direction as the non-scanning direction, it is also available to adopt an arrangement in which the reaction force, which is generated when the wafer stages WST1, WST2 are driven in the X direction, is released, for example, to the floor surface. The technique, in which the reaction force generated by the movement of the wafer stage is mechanically released to the floor (ground) by using the frame member as described above, is described, for example, in U.S. Pat. No. 5,528,118 corresponding to Japanese Patent Application Laid-Open No. 8-166475, which is incorporated herein by reference.

For example, the following arrangement may be adopted. That is, the first X axis sliders 19A, 20A and the second X axis sliders 19B, 20B are arranged on the floor 1 not on the base plate 12. The wafer base 13 is supported with a vibration-preventive mechanism (corresponding, for example, to the vibration-preventive pedestals 11A to 11C described above) on the base plate 12 so that the base plate 12 can be regarded as the floor 1. The wafer base 13 is supported by the variable mounts 52A to 52C so that the wafer base 13 is separated from the base plate 12. Alternatively, the wafer base 13 is allowed to hang from the support plate 53 with a column or the like.

In the embodiment described above, the both of the wafer stage-driving mechanism shown in FIGS. 2 to 4 and the wafer stage-focusing and leveling mechanism shown in FIG. 5 are used. However, it is enough that only any one of them may be used. Further, the arrangement of the components other than the both mechanisms is not limited to that described in the embodiment.

In the embodiment described above, the base plate 12 is arranged by the aid of the vibration-preventive pedestals 11A to 11C on the floor 1. The wafer base 13, the first columns 59A to 59C, and the second columns 51A, 51B are provided on the base plate 12. However, the present invention is not limited to this arrangement. That is, in place of the arrangement of the wafer base 13 on the base plate 12, for example, the wafer base 13 may hang on the support plate 53 by the aid of a column, or the base plate 12 may be supported with the variable mounts 52A to 52C. In addition thereto or singly, in place of the vibration-preventive pedestals 11A to 11C, for example, the following arrangement may be available. That is, the wafer base 13 may be supported on the floor 1 or the base plate 12 with a vibration-preventive mechanism different from the vibration-preventive mechanism (variable mounts 52A to 52C) for the second columns 51A, 51B.

The projection exposure apparatus according to the embodiment of the present invention can be produced by assembling the reticle stage system and the wafer stage system composed of a large number of mechanical parts, optically adjusting the projection optical system PL composed of the plurality of lenses, installing the projection optical system PL to the support plate 53, and performing the overall adjustment (for example, electric adjustment and confirmation of the operation). It is desirable that the projection exposure apparatus is produced in a clean room in which, for example, the temperature and the cleanness are managed.

Next, explanation will be made with reference to FIG. 9 for an example of the process for producing a semiconductor device based on the use of the projection exposure apparatus of this embodiment.

FIG. 9 shows exemplary steps for producing a semiconductor device. In FIG. 9, the wafer W is firstly produced, for example, from silicon semiconductor. After that, photoresist is applied onto the wafer W (step S10). In the next step S12, the reticle R1 shown in FIG. 1 is moved to the position under the illumination area so that all of the shot areas SE on the wafer W are subjected to scanning exposure with a pattern (indicated by the symbol A) on the reticle R1. Subsequently, in the step S14, a predetermined pattern is formed on the respective shot areas SE on the wafer W by performing, for example, the development, the etching, and the ion implantation.

Subsequently, in the step S16, the photoresist is applied onto the wafer W. In the step S18 to be performed thereafter, another reticle (referred to as "reticle R2") in place of the reticle R1 shown in FIG. 1 is moved to the position under the illumination area so that the respective shot areas SE on the wafer W are subjected to scanning exposure with a pattern (designated by the symbol B) on the reticle R2. In the step S20, for example, the development, the etching, and the ion implantation are performed for the wafer W. Thus, a predetermined pattern is formed on the respective shot areas on the wafer W.

The steps ranging from the exposure step to the pattern formation step described above (step S16 to step S20) are repeated in a necessary number of times required to produce a desired semiconductor device. For example, the dicing step (step S22) for separating one by one the respective chips CP on the wafer W, the bonding step, and the packaging step (step S24) are performed. Thus, the semiconductor device SP as a product is produced.

In the embodiment described above, the present invention is applied to the projection exposure apparatus based on the scanning exposure system. However, the present invention is not limited thereto. The present invention is also applicable to the projection exposure apparatus of the full field exposure type such as those based on the step-and-repeat system. In such a case, the magnification of the projection optical system is not limited to the reduction system, which may be either the 1×magnification system or the magnification system. As for the projection optical system, when the far ultraviolet ray such as the excimer laser is used, it is desirable to use, as a saltpeter material, a material such as quartz and fluorite which transmits the far ultraviolet ray. When the $F_2$ laser or the like is used, it is desirable to use an optical system based on the cata-dioptric system or the reflecting system.

Further, the present invention is equivalently applicable even in the case of the exposure apparatus based on the proximity system, the exposure apparatus based on the use of the exposure light beam of the X-ray such as the hard X-ray and the EUV light beam in the soft X-ray region, and the exposure apparatus based on the use of the exposure light beam of the charged particle beam (energy beam) such as the electron beam and the ion beam. When the X-ray is used, for example, the reflecting system may be used for the illumination system and the projection system (especially in the case of the EUV light beam, the reflecting type projection system is used, and one of the reflecting type is also used for the reticle). When the electron beam is used, an electronic optical system composed of an electronic lens and a deflector may be used as the projection system (optical system). It is needless to say that the optical path, through which the electron beam passes, is in a vacuum state. Further, when the electron beam is used, it is possible to use, as an electron gun, lanthanum hexaboride ($LaB_6$) or tantalum (Ta) of the thermionic emission type.

The way of the use of the exposure apparatus is not limited to the exposure apparatus for producing the semiconductor. For example, the present invention is also widely applicable to the exposure apparatus for the liquid crystal element formed on the angular type glass plate and the display device such as the plasma display, and the exposure apparatus for producing the image pickup device (for example, CCD), the micromachine, the thin film magnetic head, and the DNA chip.

Further, when the linear motor is used for the wafer stage system and/or the reticle stage system, the movable stage may be held in accordance with any system including, for example, the air-floating type based on the use of the air bearing and the magnetically floating type. Further, the stage may be of the type in which the stage is moved along the guide, or of the guide-less type in which the guide is not provided.

As disclosed in U.S. Pat. No. 6,020,710 corresponding to Japanese Patent Application Laid-Open No. 8-33022, the reaction force, which is generated during the acceleration or deceleration, for example, during the scanning exposure for the reticle stage, may be mechanically released to the floor (ground) by using a frame member. U.S. Pat. No. 6,020,710 is incorporated herein by reference.

It is a matter of course that the present invention is not limited to the embodiments described above, which may be embodied in other various forms within a range not deviating from the gist or essential characteristics of the present invention. All of the contents of disclosure of Japanese Patent Application No. 11-362591 filed on Dec. 21, 1999 including the specification, claims, drawings, and abstract are quoted and entirely incorporated into this application.

According to the first exposure method and the corresponding exposure apparatus, the reaction forces, which are generated when the first movable stage and the second movable stage are driven, are dealt with independently from each other. Therefore, the influence of vibration is hardly transmitted mutually between the two movable stages on each of which the substrate (wafer or the like) as the exposure objective to serve as the second object is placed. An advantage is obtained such that the high exposure accuracy is obtained in addition to the fact that the high throughput is obtained.

According to the second exposure method and the corresponding exposure apparatus, the sample base is driven with respect to the movable stage in the plane which is substantially parallel to the surface on which the movable stage is placed so that the law of conservation of momentum is substantially satisfied. Therefore, the external vibration is hardly transmitted to the movable stage for the substrate as the exposure objective to serve as the second object. Thus, the high exposure accuracy is obtained.

In this case, when the sample base is placed on the movable stage by the aid of the vibration-preventive member such as gas-based or liquid-based ones and the electromagnetic damper having the position-measuring function, and the driving unit is provided to drive the sample base with respect to the movable stage in the non-contact state in the direction substantially perpendicular to the surface on which the movable stage is placed, then the following advantage is obtained. That is, the leveling or the focusing can be performed at the high speed for the substrate as the exposure objective to serve as the second object, and the influence of vibration on the substrate is further decreased.

According to the third exposure apparatus of the present invention, the buffer member is provided between the movable stage and the sample base. Therefore, the external vibration is hardly transmitted to the movable stage for the substrate as the exposure objective to serve as the second object. Thus, the high exposure accuracy is obtained.

According to the fourth and fifth exposure apparatuses of the present invention, the movable member (movable stage) is driven at least in one direction in the state in which the law of conservation of momentum is satisfied. Therefore, the vibration during the driving is decreased. Thus, the high exposure accuracy is obtained.

According to the method for producing the device of the present invention, the external vibration is hardly transmitted to the movable stage on which the substrate as the exposure objective is placed, owing to the use of the exposure method or the exposure apparatus of the present invention. Thus, the high exposure accuracy is obtained. Therefore, the device having the high function, which is excellent, for example, in the pattern faithfulness such as the line width accuracy, can be mass-produced.

What is claimed is:

1. An exposure method for exposing a second object with an exposure light beam via a first object, the exposure method comprising:

preparing a first stage system which comprises a first movable stage on which a first substrate corresponding to the second object is placed, and a second stage system which comprises a second movable stage on which a second substrate corresponding to the second object is placed, the second stage system being independent of the first stage system;

two-dimensionally driving the first and second movable stages on a predetermined guide surface respectively; and counteracting a reaction force, which is generated when the first movable stage is driven, within the first stage system, and counteracting a reaction force, which is generated when the second movable stage is driven, within the second stage system.

2. The exposure method according to claim 1, wherein:
the first object and one of the first and second substrates are relatively move in a predetermined direction when the one of the first and second substrates is exposed with the exposure light beam; and the first and second movable stages are driven while substantially satisfying law of conservation of momentum within the first and second stage systems, respectively when the first and second movable stages are driven in the predetermined direction.

3. An exposure apparatus for exposing a second object with an exposure light beam via a first object, the exposure apparatus comprising:

a first stage system which comprises a first movable stage on which a first substrate corresponding to the second object is placed;

a second stage system which comprises a second movable stage on which a second substrate corresponding to the second object is placed, the second stage system being independent of the first stage system; and a reaction force-counteracting system which counteracts a reaction force, which is generated when the first movable stage is driven, within the first stage system, and counteracts a reaction force, which is generated when the second movable stage is driven, within the second stage system.

4. The exposure apparatus according to claim 3, wherein the reaction force counteracting system includes:

a first driving system which drives the first movable stage in a first direction and a second direction which are intersected with each other respectively while substantially satisfying law of conservation of momentum; and a second driving system which drives the second movable stage in the first direction and the second direction respectively while substantially satisfying the law of conservation of momentum, independently from the first driving system.

5. The exposure apparatus according to claim 4, wherein the first driving system includes:

a pair of first slide members which are disposed so as to define a movement area of the first movable stage therebetween and which are arranged movably in parallel to one another in the first direction;

a second slide member which is arranged movably in the second direction with respect to the first slide members;

a first driving unit which relatively drives the second slide member in the first direction with respect to the first slide members; and a second driving unit which relatively drives the first movable stage in the second direction with respect to the second slide member, and the second driving system includes:

a pair of third slide members which are disposed so as to define a movement area of the second movable stage therebetween and which are arranged movably in parallel to the first slide members in the first direction;

a fourth slide member which is arranged movably in the second direction with respect to the third slide members;

a third driving unit which relatively drives the fourth slide member in the first direction with respect to the third slide members; and a fourth driving unit which relatively drives the second movable stage in the second direction with respect to the fourth slide member.

6. The exposure apparatus according to claim 5, wherein:
the first object and the second object are relatively moved in the second direction when the second object is exposed with the exposure light beam, and the exposure apparatus further comprises a position-correcting driving unit which is provided to correct positions of the second slide member and the fourth slide member in the second direction respectively.

7. The exposure apparatus according to claim 5, further comprising a position-correcting driving unit which is provided to correct positions of the first slide members and the third slide members in the first direction respectively.

8. The exposure apparatus according to claim 3, wherein:
the first and second movable stages are driven in first and second directions which are intersected with each other;
the first object and one of the first and second substrates are relatively moved in the second direction when the one of the first and second substrates is exposed with the exposure light beam, and the exposure apparatus further comprises:
a first position-measuring unit which is arranged to measure positions of the first and second movable stages in the first direction independently from each other;
a plurality of second position-measuring units which are arranged at predetermined intervals in the first direction to measure positions of the first and second movable stages in the second direction; and
a measuring unit-switching system which delivers a measured value between the plurality of second position-measuring units when the first and second movable stages are moved in the first direction.

9. A method for producing a device, comprising the step of performing exposure by using the exposure apparatus as defined in claim 3, including:
a first stage system which comprises a first movable stage on which a first substrate corresponding to the second object is placed;
a second stage system which comprises a second movable stage on which a second substrate corresponding to the second object is placed, the second stage system being independent of the first stage system; and
a reaction force counteracting system which counteracts a reaction force, which is generated when the first movable stage is driven, within the first stage system, and counteracts a reaction force, which is generated when the second movable stage is driven, within the second stage system.

10. A method for producing an exposure apparatus which exposes a second object with an exposure light beam via a first object, the method comprising:
placing, on a predetermined base member, a first stage system which comprises a first movable stage on which a first substrate corresponding to the second object is placed and a second stage system which comprises a second movable stage on which a second substrate corresponding to the second object is placed, the second stage system being independent of the first stage system; and
installing a reaction force-counteracting system which counteracts a reaction force, which is generated when the first movable stage is driven, within the first stage system, and counteracts a reaction force, which is generated when the second movable stage is driven, within the second stage system.

11. An exposure method for exposing a second object with an exposure light beam via a first object, the exposure method comprising:
preparing a movable stage which is arranged movably at least in a one-dimensional direction and a sample base which is arranged movably two-dimensionally with respect to the movable stage and on which the second object is placed;
two-dimensionally driving the sample base with respect to the movable stage in a plane parallel to a guide surface on which the movable stage is placed so that law of conservation of momentum is substantially satisfied with respect to the sample base independently of movement of the movable stage.

12. The exposure method according to claim 11, wherein:
the sample base is supported in a state in which the sample base is tiltable and movable in a direction perpendicular to the guide surface with respect to the movable stage; and
an attitude of the sample base with respect to the movable stage is controlled so that an exposure plane of the second object on the sample base is conformed to an image plane of the first object.

13. A method for producing a device, comprising the step of performing exposure by using the exposure method as defined in claim 11, including:
preparing a movable stage which is arranged movably at least in a one-dimensional direction and a sample base which is arranged movable two-dimensionally with respect to the movable stage and on which the second object is placed; and
two-dimensionally driving the sample base with respect to the movable stage in a plane parallel to a guide surface on which the movable stage is placed so that law of conservation of momentum is substantially satisfied.

14. The exposure method according to claim 11, wherein the sample base is driven in two dimensions or more with respect to the movable stage so that law of conservation of momentum is substantially satisfied with respect to the sample base independently of movement of the movable stage.

15. The exposure method according to claim 14, wherein the sample base is driven along six axes with respect to the movable stage so that law of conservation of momentum is substantially satisfied with respect to the sample base independently of movement of the movable stage.

16. An exposure apparatus for exposing a second object with an exposure light beam via a first object, the exposure apparatus comprising:
a movable stage which is arranged movably at least in a one-dimensional direction;
a sample base which is arranged movably two-dimensionally with respect to the movable stage and on which the second object is placed; and
a first driving unit which drives the sample base two-dimensionally with respect to the movable stage in a plane substantially parallel to a surface on which the movable stage is placed so that law of conservation of momentum is substantially satisfied with respect to the sample base independently of movement of the movable stage.

17. The exposure apparatus according to claim 16, wherein:
the sample base is placed on the movable stage with a gas-based or liquid-based vibration-preventive member intervening therebetween; and
the exposure apparatus further comprises a second driving unit which drives the sample base with respect to the movable stage in a non-contact state in a direction substantially perpendicular to the surface on which the movable stage is placed.

18. A method for producing a device, comprising the step of performing exposure by using the exposure apparatus as defined in claim 16, including:
- a movable stage which is arranged movably at least in a one-dimensional direction;
- a sample base which is arranged movably two-dimensionally with respect to the movable stage and on which the second object is placed; and
- a first driving unit which drives the sample base two-dimensionally with respect to the movable stage in a plane substantially parallel to a surface on which the movable stage is placed so that law of conservation of momentum is substantially satisfied.

19. An exposure apparatus for exposing a second object with an exposure light beam via a first object, the exposure apparatus comprising:
- a movable stage which is arranged movably at least in a one-dimensional direction;
- a buffer member which is arranged movably two-dimensionally with respect to the movable stage;
- a sample base which is arranged movably two-dimensionally with respect to the buffer member and on which the second object is placed; and
- a first driving unit which drives the buffer member two-dimensionally with respect to the movable stage.

20. The exposure apparatus according to claim 19, wherein:
- the buffer member is placed on the movable stage with a gas-based or liquid-based vibration-preventive member intervening therebetween; and
- the first driving unit drives the buffer member with respect to the movable stage in a plane substantially parallel to a surface on which the movable stage is placed.

21. The exposure apparatus according to claim 20, wherein the vibration-preventive member has a self-restoring function.

22. The exposure apparatus according to claim 19, further comprising a second driving unit which drives the sample base two-dimensionally with respect to the buffer member in a non-contact state in the plane substantially parallel to the surface on which the movable stage is placed.

23. The exposure apparatus according to claim 22, further comprising a third driving unit which drives the sample base with respect to the buffer member in a non-contact state in a direction substantially perpendicular to the surface on which the movable stage is placed at a plurality of positions.

24. The exposure apparatus according to claim 23, wherein the sample base is driven with respect to the buffer member in the perpendicular direction by the third driving unit so that law of conservation of momentum is substantially satisfied.

25. The exposure apparatus according to claim 19, further comprising:
- a slide member which is driven in a first direction and which is arranged movably in a second direction intersecting the first direction;
- a fourth driving unit which drives the movable stage relative to the slide member in the second direction; and
- a position-correcting driving unit which is provided to correct a position of the slide member in the second direction.

26. A method for producing a device, comprising the step of performing exposure by using the exposure apparatus as defined in claim 19, including:
- a movable stage which is arranged movably at least in a one dimensional direction;
- a buffer member which is arranged movably two-dimensionally with respect to the movable stage;
- a sample base which is arranged movably two-dimensionally with respect to the buffer member and on which the second object is placed; and
- a first driving unit which drives the buffer member two-dimensionally with respect to the movable stage.

27. The exposure apparatus according to claim 19, wherein the buffer member is two-dimensionally driven with respect to the movable stage by the first driving unit so that law of conservation of momentum is substantially satisfied.

28. The exposure apparatus according to claim 19, further comprising a positional-measuring unit which measures a positional relationship between the buffer member and the sample base.

29. The exposure apparatus according to claim 19, wherein a vibration-preventive member which has a self-restoring function is arranged between the buffer member and the sample base.

30. A method for producing an exposure apparatus for exposing a second object with an exposure light beam via a first object, the method comprising:
- arranging a movable stage movably at least in a one-dimensional direction on a predetermined base member;
- arranging, movably two-dimensionally with respect to the movable stage, a samples base on which the second object is placed; and
- installing a driving unit which drives the sample base two-dimensionally with respect to the movable stage in a plane substantially parallel to a surface on which the movable stage is placed so that law of conservation of momentum is substantially satisfied with respect to the sample base independently of movement of the movable stage.

31. A method for producing an exposure apparatus for exposing a second object with an exposure light beam via a first object, the method comprising:
- arranging a movable stage movably at least in a one-dimensional direction on a predetermined base member;
- arranging a buffer member movably two-dimensionally with respect to the movable stage;
- arranging, movably two-dimensionally with respect to the buffer member, a sample base on which the second object is placed; and
- installing a driving unit which drives the buffer member two-dimensionally with respect to the movable stage.

32. An exposure apparatus for exposing a second object with an exposure light beam via a first object, the exposure apparatus comprising:
- a movable member which holds one of the first and second objects;
- a first guide member which defines movement of the movable member in a first direction;
- a support mechanism which supports the first guide member so that the first guide member is moved to counteract reaction forces resulting from movement of the movable member and substantially satisfy law of conservation of momentum with respect to the movable member during the movement of the movable member; and
- an adjusting unit which detects information on a position of the first guide member to adjust the position of the first guide member based on a result of the detection.

33. A method for producing a device, comprising the step of performing exposure by using the exposure apparatus as defined in claim 32, including:
 a movable member which holds one of the first and second objects;
 a first guide member which defines movement of the movable member in a first direction;
 a support mechanism which supports the first guide member so that the first guide member is moved while substantially satisfying law of conservation of momentum during the movement of the movable member; and
 an adjusting unit which detects information on a position of the first guide member to adjust the position of the first guide member based on a result of the detection.

34. The exposure apparatus according to claim 32, wherein the movable member is coupled to the first guide member substantially in a non-contact manner, and the support mechanism supports the first guide member substantially in a non-contact manner.

35. The exposure apparatus according to claim 34, wherein the first guide member is arranged on a second base member which is different from a first base member on which the movable member is arranged.

36. The exposure apparatus according to claim 32, further comprising a driving unit which dries the first guide member so that the movable member is moved in a second direction perpendicular to the first direction, and a second guide member which defines movement of the first guide member in the second direction, wherein the second guide member is moved while satisfying the law of conservation of momentum during the movement of the movable member.

37. The exposure apparatus according to claim 36, wherein:
 the first and second objects are moved relative to the exposure light beam respectively to perform scanning exposure for the second object with the exposure light beam; and
 the movable member holds the second object, and the movable member is moved in the first direction during the scanning exposure.

38. A method for producing a device, comprising the step of performing exposure by using the exposure method as defined in claim 1, including:
 preparing a first stage system which comprises a first movable stage on which a first substrate corresponding to the second object is placed, and a second stage system which comprises a second movable stage on which a second substrate corresponding to the second object is placed, the second stage system being independent of the first stage system;
 two-dimensionally driving the first and second movable stages on a predetermined guide surface respectively; and
 counteracting a reaction force, which is generated when the first movable stage is driven, within the first stage system, and counteracting a reaction force, which is generated when the second movable stage is driven, within the second stage system.

39. An exposure method for exposing a second object with an exposure light beam via a first object, the exposure method comprising:
 preparing a movable stage which is arranged movably and a sample base which is arranged movably in an X direction, a Y direction, a Z direction, a rotational direction about an X axis, a rotational direction about a Y axis and a rotational direction about a Z axis with respect to the movable stage and on which the second object is placed; and
 driving the sample base with respect to the movable stage so that law of conservation of momentum is substantially satisfied with respect to the sample base independently of movement of the movable stage at least in three directions of the X direction, the Y direction, the Z direction, the rotational direction about the X axis, the rotational direction about the Y axis and the rotational direction about the Z axis.

40. An exposure method for exposing a second object with an exposure light beam via a first object, the exposure method comprising:
 preparing a movable stage which is arranged movably and a sample base which is arranged movably in an X direction, a Y direction, a Z direction, a rotational direction about an X axis, a rotational direction about a Y axis and a rotational direction about a Z axis with respect to the movable stage and on which the second object is placed; and
 driving the sample base with respect to the movable stage so that law of conservation of momentum is substantially satisfied with respect to the sample base independently of movement of the movable stage in all of the X direction, the Y direction, the Z direction, the rotational direction about the X axis, the rotational direction about the Y axis and the rotational direction about the Z axis.

41. An exposure apparatus for exposing a second object with an exposure light beam via a first object while relatively moving the first object and the second object in a first direction, the exposure apparatus comprising:
 a movable stage which is arranged movably in the first direction and a second direction perpendicular to the first direction on a predetermined base member, and on which the second object is placed;
 a movable member which moves to counteract reaction forces resulting from movement of the movable stage and substantially satisfy law of conservation of momentum with respect to the movable stage during movement of the movable stage in the first direction; and
 an adjusting mechanism which adjusts a position of the movable member in the first direction during movement of the movable stage in the second direction.

42. The exposure apparatus according to claim 41, wherein a plurality of comparted areas arranged two-dimensionally are provided on the second object, and the adjusting mechanism adjusts the position of the movable member during a column-to-column migration period in which an objective area for the exposure is shifted to a comparted area of a subsequent column on the second object.

43. The exposure apparatus according to claim 42, further comprising a position-measuring unit which measures the position of the movable member in the first direction, and wherein the adjusting mechanism adjusts the position of the movable member on the basis of a measurement result of the position-measuring unit.

44. The exposure apparatus according to claim 41, wherein the movable stage comprises a first movable stage and a second movable stage, each of which places the second object thereon, and wherein the movable member comprises a first movable member which moves to counteract reaction forces resulting from movement of the first movable stage and substantially satisfy law of conservation of momentum with respect to the first movable stage during the movement of the first movable stage in the first direction and a second movable member which moves to counteract reaction forces resulting from movement of the second movable stage and substantially satisfy law of conservation of momentum with respect to the second movable stage during the movement of the second movable stage in the first direction, the first and second movable members being placed in the vicinity of end portions of the first and second movable stages, respectively, so that the first movable member and the second movable member are apart from each other with the longest distance in the second direction.

45. An exposure apparatus for exposing a second object with an exposure light beam via a first object while moving the first object relative to the second object in a first direction, the exposure apparatus comprising:
- a movable stage which is arranged movably in a first direction and a second direction perpendicular to the first direction on a predetermined base member, and on which the second object is placed;
- a movable member which moves to counteract reaction forces resulting from movement of the movable stage and substantially satisfy law of conservation of momentum with respect to the movable stage during movement of the movable stage in the second direction; and
- an adjusting mechanism which adjusts a position of the movable member in the second direction.

46. The exposure apparatus according to claim 45, further comprising a position-measuring unit which measures the position of the movable member in the second direction, and wherein the adjusting mechanism adjusts the position of the movable member on the basis of a measurement result of the position-measuring unit.

47. The exposure apparatus according to claim 46, wherein the movable stage comprises a plurality of movable stages, and wherein the movable member, the adjusting mechanism and the position-measuring unit are provided in each of the movable stages.

48. An exposure apparatus for exposing a second object with an exposure light beam via a first object, the exposure apparatus comprising:
- a movable stage which is arranged movably in a first direction and a second direction perpendicular to the first direction on a predetermined base member, and on which the second object is placed;
- a first movable member which moves to counteract reaction forces resulting from movement of the movable stage and substantially satisfy law of conservation of momentum with respect to the movable stage during movement of the movable stage in the first direction; and
- a second movable member which moves to counteract reaction forces resulting from movement of the movable stage and substantially satisfy law of conservation of momentum with respect to the movable stage during movement of the movable stage in the second direction, and which is different from the first movable member.

49. The exposure apparatus according to claim 48, wherein the first movable member comprises a first guide member which guides the movable stage in the first direction, and the second movable member comprises a second guide member which guides the movable stage in the second direction.

50. The exposure apparatus according to claim 48, wherein the movable stage comprises a plurality of movable stages, and wherein the first movable member and the second movable member are provided for each of the movable stages.

51. An exposure apparatus for exposing a second object with an exposure light beam via a first object while moving the first object relative to the second object in a first direction, the exposure apparatus comprising:
- a movable stage which is arranged movably in the first direction and a second direction perpendicular to the first direction on a predetermined base member, and on which the second object is placed;
- a movable member which moves to counteract reaction forces resulting from movement of the movable stage and substantially satisfy law of conservation of momentum with respect to the movable stage during movement of the movable stage in both of a first state in which the exposure light beam is irradiated onto the second object and in a second state in which the exposure light beam is not irradiated onto the second object.

52. The exposure apparatus according to claim 51, wherein the movable member comprises a first movable member which moves in the first state and a second movable member which moves in the second state and which is different from the first movable member.

53. The exposure apparatus according to claim 52, wherein the first movable member moves in the first direction in synchronization with the movement of the movable stage, and the second movable member moves in the second direction in synchronization with the movement of the movable stage.

54. The exposure apparatus according to claim 53, wherein the first movable member comprises a first guide member which guides the movable stage in the first direction, and the second movable member comprises a second guide member which guides the movable stage in the second direction.

55. The exposure apparatus according to claim 51, wherein the movable stage comprises a plurality of movable stages, and wherein the movable member is provided in each of the movable stages.

56. An exposure apparatus for exposing a second object with an exposure light beam via a first object while moving the first object relative to the second object in a first direction, the exposure apparatus comprising:
- a first movable stage which is arranged movably in the first direction and a second direction perpendicular to the first direction on a base member, and on which the second object is placed;
- a second movable stage which is arranged movably in the first direction and the second direction on the base member, and on which the second object is placed;
- a first movable member which moves to counteract reaction forces resulting from movement of the first movable stage and substantially satisfy law of conservation of momentum with respect to the first movable stage during movement of the first movable stage in a first state in which the exposure light beam is irradiated onto the second object placed on the first movable stage; and
- a second movable member which moves to counteract reaction forces resulting from movement of the second movable stage and substantially satisfy law of conservation of momentum with respect to the second movable stage during movement of the second movable stage in the first state.

* * * * *